(12) United States Patent
Arifuku et al.

(10) Patent No.: US 11,810,794 B2
(45) Date of Patent: Nov. 7, 2023

(54) SETTING METHOD OF PROTECTIVE COMPONENT AND MANUFACTURING METHOD OF PROTECTIVE COMPONENT

(71) Applicant: DISCO CORPORATION, Tokyo (JP)

(72) Inventors: Norihisa Arifuku, Tokyo (JP);
Tomohiro Kaneko, Tokyo (JP);
Akifumi Suzuki, Tokyo (JP);
Masamitsu Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 334 days.

(21) Appl. No.: 17/089,984

(22) Filed: Nov. 5, 2020

(65) Prior Publication Data

US 2021/0151331 A1 May 20, 2021

(30) Foreign Application Priority Data

Nov. 14, 2019 (JP) ................................ 2019-206409

(51) Int. Cl.
| | |
|---|---|
| *H01L 21/56* | (2006.01) |
| *B29C 51/42* | (2006.01) |
| *B29C 51/00* | (2006.01) |
| *H01L 21/683* | (2006.01) |

(52) U.S. Cl.
CPC .......... *H01L 21/565* (2013.01); *B29C 51/002* (2013.01); *B29C 51/42* (2013.01); *H01L 21/6836* (2013.01)

(58) Field of Classification Search
None
See application file for complete search history.

(56) References Cited

U.S. PATENT DOCUMENTS

2018/0342398 A1* 11/2018 Sekiya ................ H01L 21/3043

FOREIGN PATENT DOCUMENTS

| JP | 2013021017 A | 1/2013 |
| JP | 2019057526 A * | 4/2019 |

(Continued)

OTHER PUBLICATIONS

Machine English translation of JP-2019156996-A, Accessed Feb. 1, 2023 (Year: 2019).*

(Continued)

*Primary Examiner* — Jacob T Minskey
*Assistant Examiner* — Adrianna N Konves
(74) *Attorney, Agent, or Firm* — Greer Burns & Crain Ltd.

(57) ABSTRACT

A setting method of a protective component includes a resin supply step of supplying a thermoplastic resin to a flat support surface of a support table, and a protective component forming step of shaping the thermoplastic resin into a sheet shape through pressing and spreading the thermoplastic resin along the support surface while heating and softening the thermoplastic resin to form a protective component of the thermoplastic resin in the sheet shape on the support surface. The setting method includes also a protective component bonding step of bringing a front surface that is one surface of the workpiece into tight contact with one surface of the protective component in the sheet shape and heating the protective component in tight contact to bond the protective component to the workpiece, and a post-bonding cooling step of cooling the protective component heated in the protective component bonding step.

11 Claims, 18 Drawing Sheets

(56) References Cited

FOREIGN PATENT DOCUMENTS

JP          2019156996 A  *  9/2019
WO    WO-2015190479 A1  *  12/2015  ............ C09J 201/00

OTHER PUBLICATIONS

Machine English translation of JP-2019057526-A, Accessed Aug. 17, 2023 (Year: 2019).*
Machine English translation of WO-2015190479-A1, Accessed Aug. 17, 2023 (Year: 2015).*

* cited by examiner

SETTING METHOD OF PROTECTIVE COMPONENT AND MANUFACTURING METHOD OF PROTECTIVE COMPONENT

BACKGROUND OF THE INVENTION

Field of the Invention

The present invention relates to a setting method of a protective component and a manufacturing method of a protective component.

Description of the Related Art

When various kinds of plate-shaped workpieces such as a semiconductor wafer, a resin package substrate, a ceramic substrate, and a glass substrate are ground to be thinned or are divided by a cutting blade or laser beam, the workpieces are held by a chuck table. It is general that an adhesive tape is stuck to a held surface of the workpiece in order to prevent the surface held at the time of processing from being damaged or contaminated due to contact with the chuck table or to allow collective conveyance after the dividing (refer to Japanese Patent Laid-open No. 2013-021017).

SUMMARY OF THE INVENTION

In the method of Japanese Patent Laid-open No. 2013-021017, there is a problem that a residual of an adhesive material or the like is left on the workpiece when the adhesive tape is separated. Furthermore, there is a problem that a glue layer of the adhesive tape works as a cushion in processing and possibly the workpiece vibrates to break or a chip scatters.

Thus, an object of the present invention is to provide a setting method of a protective component and a manufacturing method of a protective component that prevent part of the protective component from being left on a workpiece as a residual when the protective component is separated from the workpiece and that reduce occurrence of a situation in which the workpiece breaks or a chip scatters because the protective component works as a cushion in processing.

In accordance with an aspect of the present invention, there is provided a setting method of a protective component that protects one surface of a plate-shaped workpiece, the setting method including a resin supply step of supplying a thermoplastic resin in a lump form, a string form, a powder form, or a fluid form to a flat support surface of a support table, a protective component forming step of shaping the thermoplastic resin into a sheet shape through pressing and spreading the thermoplastic resin along the support surface while heating and softening the thermoplastic resin to form a protective component of the thermoplastic resin in the sheet shape on the support surface, a protective component bonding step of bringing the one surface of the workpiece into tight contact with one surface of the protective component in the sheet shape and heating the protective component in tight contact to bond the protective component to the workpiece, and a post-bonding cooling step of cooling the protective component heated in the protective component bonding step.

Preferably, in a condition of heating the protective component in the protective component bonding step, a temperature is lower, or a heating time is shorter, compared with a condition of heating the thermoplastic resin in the protective component forming step.

Preferably, the protective component forming step includes a post-shaping cooling step of cooling the protective component shaped into the sheet shape. Preferably, the thermoplastic resin is shaped into the sheet shape with such a size as to cover the one surface of the workpiece without discontinuity in the protective component forming step. Preferably, the thermoplastic resin is pressed and spread by a flat pressing surface parallel to the support surface in the protective component forming step.

Preferably, the one surface of the workpiece has structural objects including projections and recesses, and a thickness of the protective component in the sheet shape shaped in the protective component forming step is set thicker than a height of each of the projections and recesses. Preferably, a filler is mixed into the thermoplastic resin supplied in the resin supply step.

Preferably, in the protective component bonding step, a peripheral region of the protective component around an outer circumference of the workpiece is bonded to an annular frame that surrounds the workpiece, and a frame unit in which the workpiece is fixed in an opening of the annular frame through the protective component is formed.

Preferably, in the protective component forming step, a thicker part of the thermoplastic resin is formed at a peripheral edge of the protective component in the sheet shape, and in the protective component bonding step, the workpiece is bonded to a region in the sheet shape, and the thicker part functions as a reinforcing component.

Preferably, a heating time of the thermoplastic resin is shorter, or a heating temperature of the thermoplastic resin is lower, or an amount of pressing of the thermoplastic resin is smaller, when the thermoplastic resin is bonded to the workpiece in the protective component bonding step than when the thermoplastic resin is shaped in the protective component forming step. Preferably, the workpiece is a semiconductor wafer having a plurality of semiconductor devices on a front surface.

In accordance with another aspect of the present invention, there is provided a manufacturing method of a protective component that protects one surface of a plate-shaped workpiece, the manufacturing method including a resin supply step of supplying a thermoplastic resin in a lump form, a string form, a powder form, or a fluid form to a flat support surface of a support table, and a protective component forming step of shaping the thermoplastic resin into a sheet shape through pressing and spreading the thermoplastic resin along the support surface while heating and softening the thermoplastic resin to form a protective component of the thermoplastic resin in the sheet shape on the support surface.

Preferably, the protective component forming step includes a post-shaping cooling step of cooling the thermoplastic resin shaped into the sheet shape.

According to the invention of the present application, it is possible to prevent part of the protective component from being left on the workpiece as a residual when the protective component is separated from the workpiece and reduce occurrence of a situation in which the workpiece breaks or a chip scatters because the protective component works as a cushion in processing.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not limited by contents described in the following embodiments. Furthermore, what can be easily conceived by those skilled in the art and what are substantially the same are included in constituent elements described below. Moreover, configurations described below can be combined as appropriate. In addition, various kinds of omission, replacement, or change of a configuration can be executed without departing from the gist of the present invention.

First Embodiment

Figure 1:
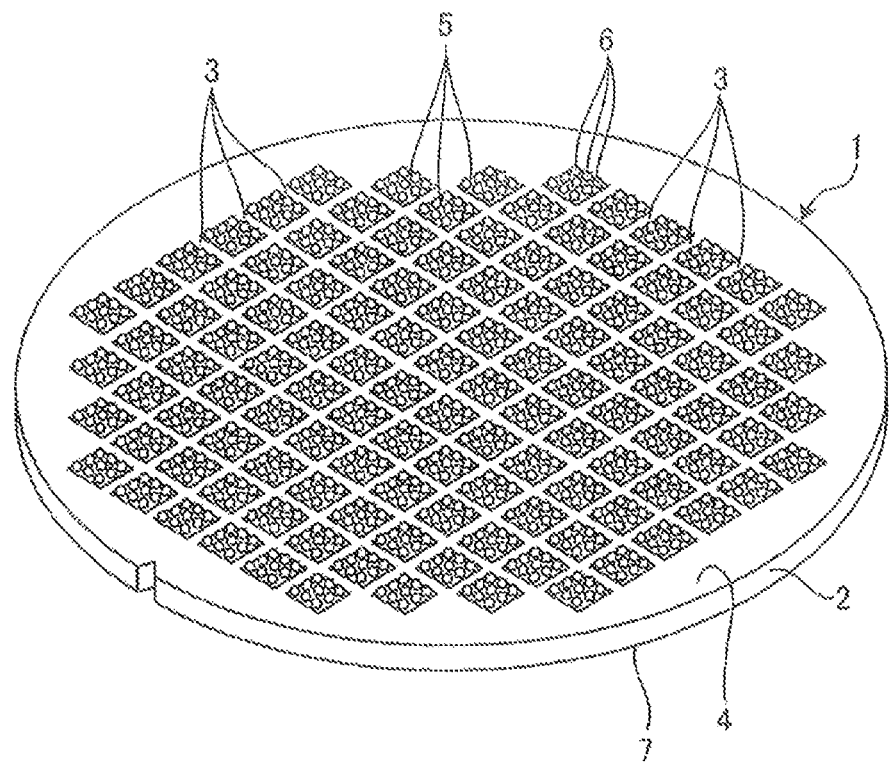
FIG. 1 is a perspective view depicting a workpiece to be processed in a setting method of a protective component and a processing method of a workpiece according to a first embodiment.

A setting method of a protective component, a processing method of a workpiece, and a manufacturing method of a protective component according to a first embodiment of the present invention will be described based on drawings. FIG. 1 is a perspective view depicting a workpiece 1 to be processed in the setting method of a protective component and the processing method of a workpiece according to the first embodiment. In the first embodiment, the workpiece 1 is a circular-disc-shaped semiconductor wafer having, as a substrate 2, silicon, sapphire, gallium arsenide, silicon carbide (SiC) substrate, gallium nitride (GaN) substrate, lithium tantalate (LT) substrate, single-crystal diamond substrate, or the like. In the first embodiment, in the workpiece 1, a semiconductor device 5 is formed in each of regions on a front surface 4 marked out by plural planned dividing lines 3 that intersect (in the first embodiment, perpendicularly intersect) to each other as depicted in FIG. 1. The semiconductor wafer as the workpiece 1 is not limited thereto in the present invention, and the semiconductor devices 5 do not need to be formed. In the workpiece 1, plural electrode bumps 6 are mounted on a front surface of each of the semiconductor devices 5. The electrode bumps 6 protrude from the front surface of each of the semiconductor devices 5. The semiconductor devices 5 each have structural objects including projections and recesses due to the electrode bumps 6 mounted on the front surface 4. In the workpiece 1 and the semiconductor devices 5, a back surface 7 on the opposite side to the front surface 4 is formed in a flat shape. The workpiece 1 is split along each planned dividing line 3 and is divided into the individual semiconductor devices 5. In the first embodiment, the electrode bumps 6 are mounted on the front surface of each of the semiconductor devices 5, and thus, the workpiece 1 has the structural objects including projections and recesses. However, the workpiece 1 is not limited thereto in the present invention and does not need to have the structural objects including projections and recesses on the front surface of each of the semiconductor devices 5. Furthermore, in the present invention, the workpiece 1 is not limited to the semiconductor wafer having the semiconductor devices 5 on the front surface 4 and may be an optical device wafer having optical devices on the front surface 4.

Figure 2:
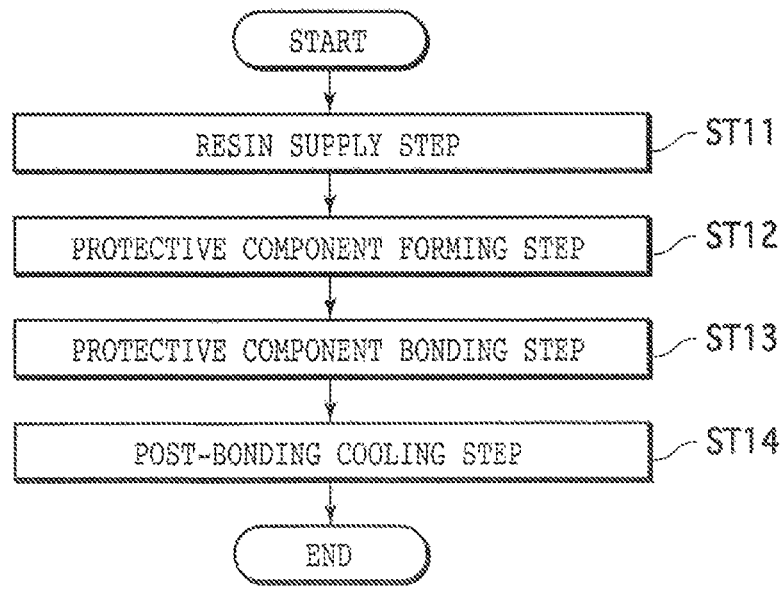
FIG. 2 is a flowchart depicting the setting method of a protective component according to the first embodiment.

Next, the setting method of a protective component and the manufacturing method of a protective component according to the first embodiment will be described. FIG. 2 is a flowchart depicting the setting method of a protective component according to the first embodiment. The setting method of a protective component is a setting method of a protective component 101 (see FIG. 5, FIG. 6, and so forth) that protects the front surface 4 that is one surface of the plate-shaped workpiece 1 and includes a resin supply step ST11, a protective component forming step ST12, a protective component bonding step ST13, and a post-bonding cooling step ST14 as depicted in FIG. 2. Furthermore, the manufacturing method of a protective component is a manufacturing method of the protective component 101 that protects the front surface 4 that is one surface of the plate-shaped workpiece 1 and includes the resin supply step ST11 and the protective component forming step ST12 that are the same as the setting method of a protective component.

In the present invention, the setting method of a protective component is not limited to the setting method of the protective component 101 that protects the front surface 4 of the workpiece 1 and may be a setting method of the protective component 101 that protects the back surface 7 of the workpiece 1. Furthermore, in the present invention, the manufacturing method of a protective component is not limited to the manufacturing method of the protective component 101 that protects the front surface 4 of the workpiece 1 and may be a manufacturing method of the protective component 101 that protects the back surface 7 of the workpiece 1.

Figure 3:
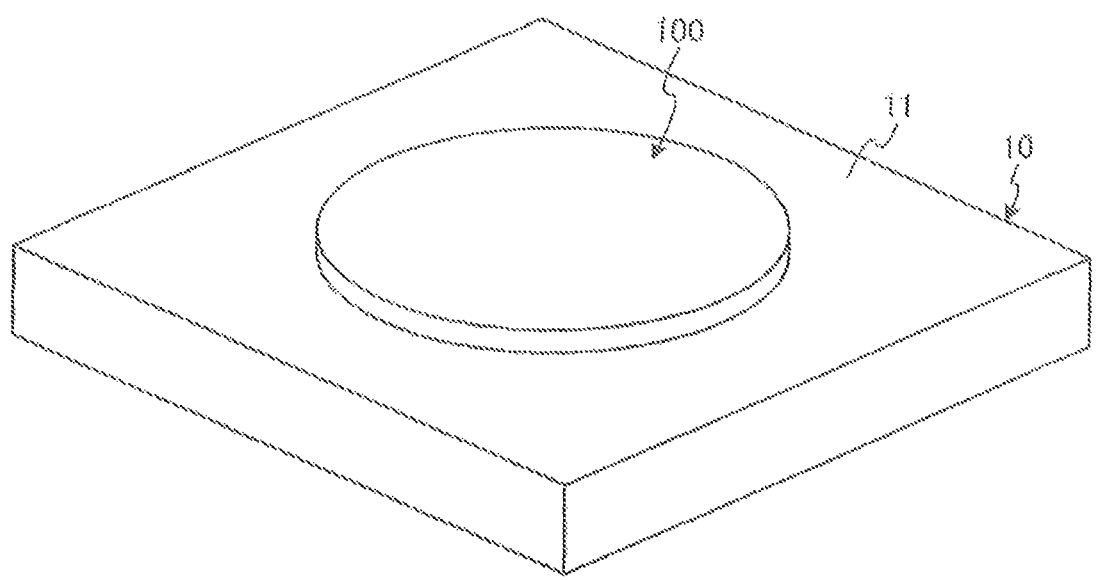
FIG. 3 is a perspective view for explaining a resin supply step in FIG. 2.

FIG. 3 is a perspective view for explaining the resin supply step ST11 in FIG. 2. The resin supply step ST11 is a step of supplying a thermoplastic resin 100 to a flat support surface 11 of a support table 10 as depicted in FIG. 3. The thermoplastic resin 100 to be supplied in the resin supply step ST11 has a lump form in the first embodiment. However, the thermoplastic resin 100 is not limited thereto in the present invention and may have a string form, a powder form, or a fluid form.

The thermoplastic resin 100 to be supplied in the resin supply step ST11 has a volume that allows the electrode bumps 6 to be covered over the whole of the front surface 4 of the workpiece 1. Specifically, the thermoplastic resin 100 to be supplied in the resin supply step ST11 has a volume that allows formation of the protective component 101 that covers the front surface 4 without discontinuity in the protective component bonding step ST13 to be described later and that allows formation of the protective component 101 thicker than the projections and recesses on the front surface 4 formed by the electrode bumps 6.

In the first embodiment, in a cured state at a lower temperature than the softening point, the thermoplastic resin 100 to be supplied in the resin supply step ST11 is a rigid body that does not have fluidity and does not have adhesiveness like that of an adhesive substantially. Therefore, adhesion of the thermoplastic resin 100 to the front surface 4, the electrode bumps 6, and so forth in the workpiece 1 is suppressed. Furthermore, in a softened state at a higher temperature than the softening point, although the thermoplastic resin 100 to be supplied in the resin supply step ST11 has fluidity, adhesiveness like that of an adhesive is not almost observed substantially. Therefore, adhesion of the thermoplastic resin 100 to the front surface 4, the electrode bumps 6, and so forth in the workpiece 1 is reduced.

As the thermoplastic resin 100 to be supplied in the resin supply step ST11, specifically, one kind or two or more kinds selected from the following substances can be cited: acrylic resin, methacrylic resin, vinyl resin, polyacetal, natural rubber, butyl rubber, isoprene rubber, chloroprene rubber, polyolefin such as polyethylene, polypropylene, poly(4-methyl-1-pentene), and poly(l-butene), polyester such as polyethylene terephthalate and polybutylene terephthalate, polyamide such as Nylon-6, Nylon-66, and poly(meta-xylylene adipamide), polyacrylate, polymethacrylate, polyvinyl chloride, polyetherimide, polyacrylonitrile, polycarbonate, polystyrene, polysulfone, polyethersulfone, polyphenylene, ether polybutadiene resin, polycarbonate resin, thermoplastic polyimide resin, thermoplastic polyurethane resin, phenoxy resin, polyamide-imide resin, fluorine resin, ethylene-unsaturated carboxylic acid copolymer resin, ethylene-vinyl acetate copolymer resin, ionomer, ethylene-vinyl acetate-maleic anhydride terpolymer resin, ethylene-vinyl acetate copolymer saponified resin, ethylene-vinyl alcohol copolymer resin, and so forth.

As the unsaturated carboxylic acid that configures the above-described ethylene-unsaturated carboxylic acid copolymer to be used for the thermoplastic resin 100 to be supplied in the resin supply step ST11, acrylic acid, methacrylic acid, maleic acid, itaconic acid, monomethyl maleate, monoethyl maleate, maleic anhydride, itaconic anhydride, and so forth are cited as examples. Here, the ethylene-unsaturated carboxylic acid copolymer includes not only the bipolymer of ethylene and unsaturated carboxylic acid but also multi-component copolymers obtained through further copolymerization of other monomers. As the above-described other monomers that may be copolymerized into the ethylene-unsaturated carboxylic acid copolymer, vinyl ester such as vinyl acetate and vinyl propionate, unsaturated carboxylic acid ester such as methyl acrylate, ethyl acrylate, isobutyl acrylate, n-butyl acrylate, methyl methacrylate, isobutyl methacrylate, dimethyl maleate, and diethyl maleate, and so forth are cited as examples.

The softening point of the thermoplastic resin 100 to be supplied in the resin supply step ST11 is a temperature in a range of 0° C. to 300° C. inclusive in the first embodiment. Because the compound group depicted above as an example is used as the thermoplastic resin 100 to be supplied in the resin supply step ST11, the softening point is a temperature in a range of 0° C. to 300° C. inclusive. For the thermoplastic resin 100 to be supplied in the resin supply step ST11, the softening point can be adjusted by mixing different kinds of compounds depicted above as examples. For example, by adjusting the softening point to a temperature higher than approximately 40° C. to 100° C., which is the temperature of the workpiece 1 in dry polishing processing, the thermoplastic resin 100 can be prevented from becoming a softened state in the dry polishing processing.

Figure 4:
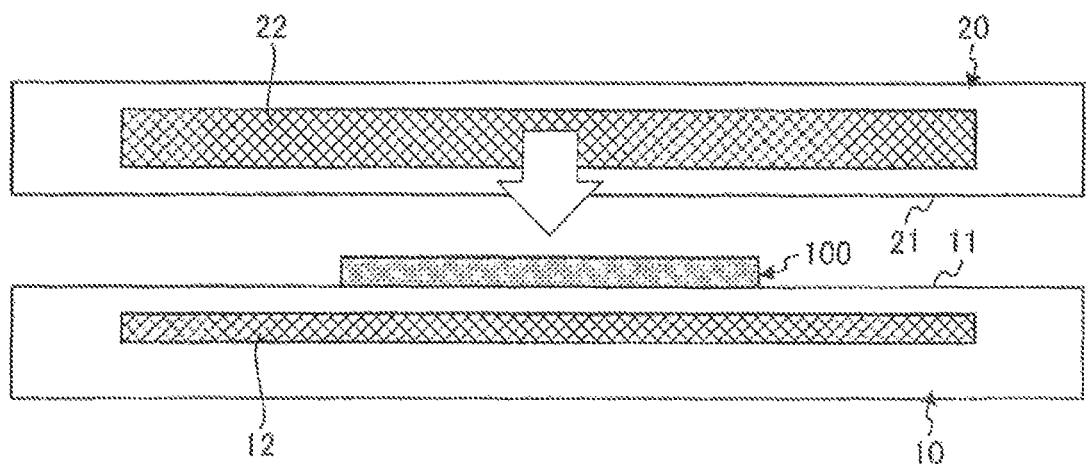
FIG. 4 is a sectional view for explaining a protective component forming step in FIG. 2.
Figure 5:
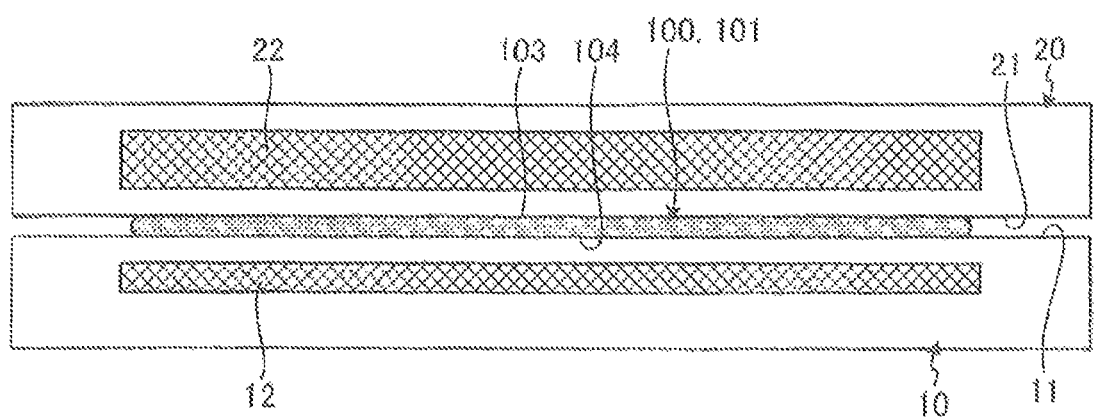
FIG. 5 is a sectional view for explaining the protective component forming step in FIG. 2.
Figure 6:
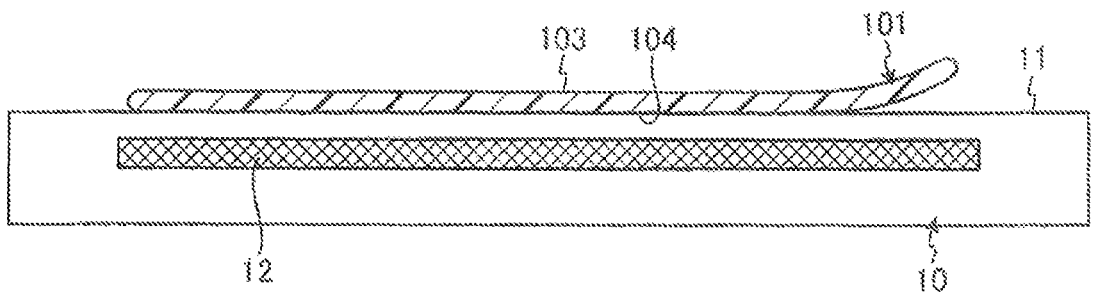
FIG. 6 is a sectional view for explaining the protective component forming step in FIG. 2.

FIG. 4, FIG. 5, and FIG. 6 are explanatory diagrams for explaining the protective component forming step ST12 in FIG. 2. The protective component forming step ST12 is executed after the resin supply step ST11. The protective component forming step ST12 is a step of shaping the thermoplastic resin 100 supplied in the resin supply step ST11 into a sheet shape through pressing and spreading the thermoplastic resin 100 along the support surface 11 while heating and softening the thermoplastic resin 100 to form the protective component 101 of the thermoplastic resin 100 in the sheet shape on the support surface 11 as depicted in FIG. 4, FIG. 5, and FIG. 6.

In the protective component forming step ST12, first, the thermoplastic resin 100 is heated and softened from the side of the support surface 11 by a heat source 12 disposed inside the support table 10. Furthermore, in the protective component forming step ST12, as depicted in FIG. 4, a flat pressing surface 21 of a pressing component 20 is made to approach the thermoplastic resin 100 and get contact with the thermoplastic resin 100 from the opposite side to the side of the support surface 11. Moreover, in the protective component forming step ST12, the thermoplastic resin 100 is further heated and softened from the side of the pressing surface 21 by a heat source 22 disposed inside the pressing component 20.

In the protective component forming step ST12, while the thermoplastic resin 100 is heated and softened by the heat sources 12 and 22 as above, as depicted in FIG. 5, the thermoplastic resin 100 on the support surface 11 is pressed and spread along the support surface 11 by the pressing surface 21 made parallel to the support surface 11 and is shaped into the sheet shape. Thereby, the protective component 101 of the thermoplastic resin 100 in the sheet shape is formed on the support surface 11. In the protective component forming step ST12, because the support surface 11 and the pressing surface 21 are both flat and are parallel to each other, the sheet-shaped protective component 101 in which one surface 103 and the other surface 104 are both flat and are parallel to each other is formed. In the protective component forming step ST12, in the first embodiment, for example, pressurization is executed by the support table 10 and the pressing component 20 while heating is executed by the heat sources 12 and 22 at 150° C. for 10 minutes, to shape the thermoplastic resin 100 into the sheet shape.

In the support table 10 to be used in the resin supply step ST11 and the protective component forming step ST12, it is preferable that the support surface 11 is coated with a release material. In this case, the possibility of adhesion of the softened thermoplastic resin 100 to the support surface 11 can be further suppressed. Similarly, in the pressing component 20 to be used in the protective component forming step ST12, it is preferable that the pressing surface 21 is coated with a release material. In this case, the possibility of adhesion of the softened thermoplastic resin 100 to the pressing surface 21 can be further suppressed. As the release material with which the support surface 11 and the pressing surface 21 are each coated, fluorine resin is cited as an example of a preferable substance. Besides, a flat resin sheet that functions as a release sheet may be disposed on each of the support surface 11 and the pressing surface 21, and this resin sheet may be peeled off from the protective component 101 and be separated after the sheet-shaped protective component 101 is formed. It is preferable that a surface of the resin sheet disposed on each of the support surface 11 and the pressing surface 21 is coated with a release material.

In the protective component forming step ST12, in the first embodiment, the thermoplastic resin 100 is heated and softened from both the side of the support surface 11 and the side of the pressing surface 21 by the heat source 12 and the heat source 22. However, the present invention is not limited thereto, and the thermoplastic resin 100 may be heated and softened from either one of the side of the support surface 11 and the side of the pressing surface 21 by either one of the heat source 12 and the heat source 22. In the protective component forming step ST12, the temperatures of both heat sources 12 and 22 may be the same or be different. The temperatures may be each set according to convenience of the next step and so forth because the sheet-shaped protective component 101 is likely to stick to the side of a lower temperature more readily.

Furthermore, the protective component forming step ST12 may be executed in a reduced-pressure chamber. In this case, mixing of air bubbles into the sheet-shaped protective component 101 can be suppressed.

In the first embodiment, the protective component forming step ST12 includes a post-shaping cooling step of cooling the protective component 101 shaped into the sheet shape. Thus, in the first embodiment, by the post-shaping cooling step, the thermoplastic resin 100 that forms the protective component 101 is cured immediately after the shaping into the sheet shape. Therefore, the shape of the protective component 101 can be rapidly stabilized. In the post-shaping cooling step, in the first embodiment, the cooling of the protective component 101 is started by turning off the heat source 12 and the heat source 22 to stop the heating of the protective component 101 by the heat source 12 and the heat source 22, for example, and the protective component 101 is cooled to approximately the temperature of the atmospheric air by the atmospheric air, for example.

The post-shaping cooling step is not limited thereto in the present invention. After the heat source 12 and the heat source 22 are turned off, in the state in which the protective component 101 is pressurized by the pressing component 20, the protective component 101 may be cooled from the side of the support surface 11 and the side of the pressing surface 21 by a cooling mechanism of air cooling, water cooling, or the like that is disposed inside each of the support table 10 and the pressing component 20 and is not depicted in the diagram. Furthermore, in the post-shaping cooling step, the heating of the protective component 101 by the heat source 22 may be stopped by separating the pressing component 20 from the protective component 101 instead of turning off the heat source 22. The post-shaping cooling step can be changed as appropriate according to whether or not the heat source 12 and the heat source 22 are each used for heating and softening of the thermoplastic resin 100 in the protective component forming step ST12.

In the protective component forming step ST12, thereafter, the pressing component 20 is separated from the protective component 101. Then, as depicted in FIG. 6, the protective component 101 shaped into the sheet shape is peeled off from the support surface 11 of the support table 10, and thereby, the sheet-shaped protective component 101 is obtained.

In the protective component forming step ST12, in the first embodiment, the thermoplastic resin 100 with a volume that allows the electrode bumps 6 to be covered over the whole of the front surface 4 of the workpiece 1 is formed into a sheet shape. Therefore, the protective component 101 is formed into the sheet shape with such a size as to cover the front surface 4 without discontinuity and into the sheet shape thicker than the projections and recesses on the front surface 4 formed by the electrode bumps 6. In the protective component forming step ST12, in the first embodiment, the thickness of the formed sheet-shaped protective component 101 can be adjusted by adjusting an amount of rising of the support table 10 and an amount of lowering of the pressing component 20.

Figure 7:
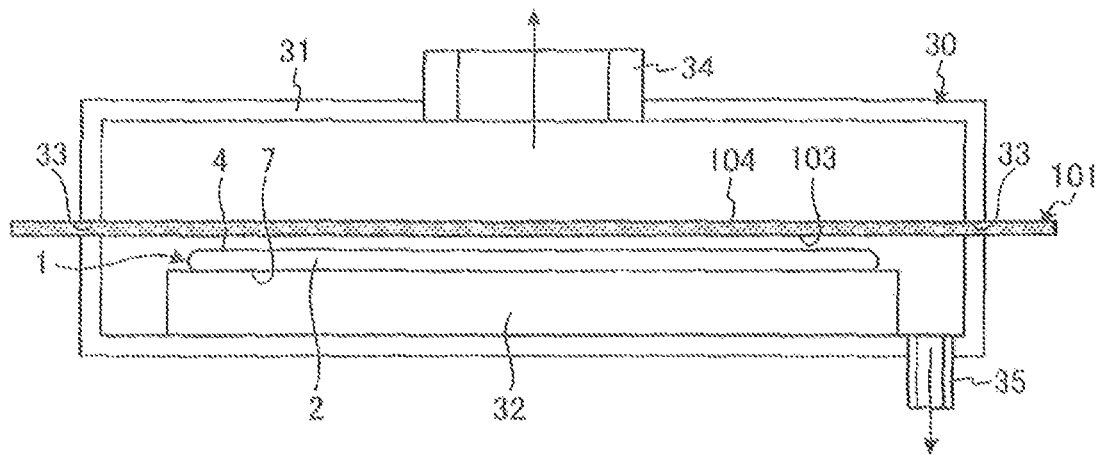
FIG. 7 is a sectional view for explaining a protective component bonding step in FIG. 2.
Figure 8:
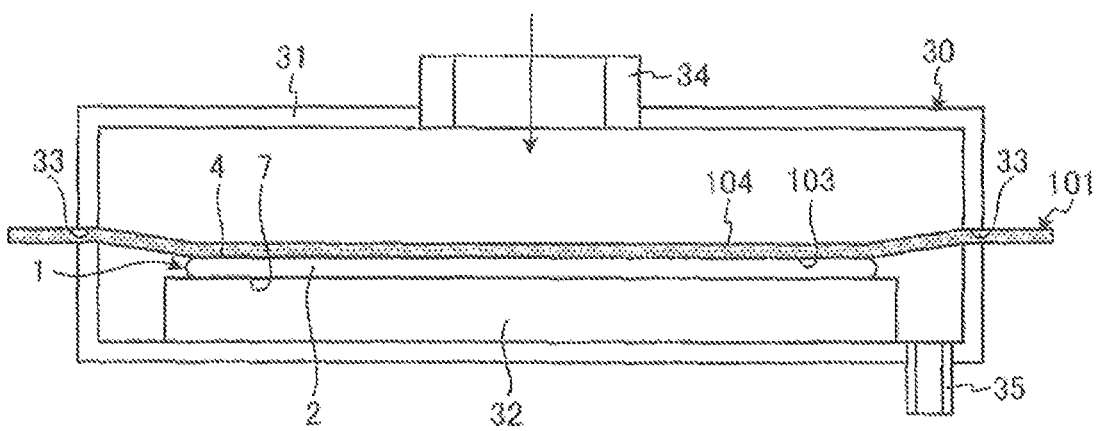
FIG. 8 is a sectional view for explaining the protective component bonding step in FIG. 2.
Figure 9:
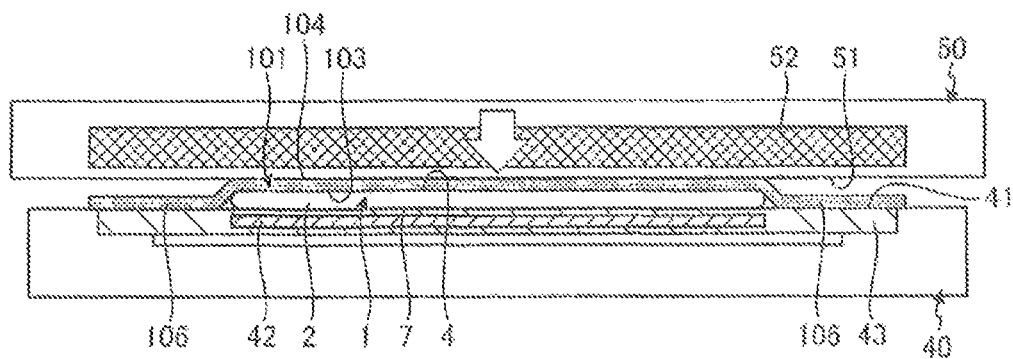
FIG. 9 is a sectional view for explaining the protective component bonding step in FIG. 2.

FIG. 7, FIG. 8, and FIG. 9 are sectional views for explaining the protective component bonding step ST13 in FIG. 2. In FIG. 7, FIG. 8, and FIG. 9, the electrode bumps 6 are omitted. The protective component bonding step ST13 is executed after the protective component forming step ST12. The protective component bonding step ST13 is a step of bringing the front surface 4 that is one surface of the workpiece 1 into tight contact with the one surface 103 of the protective component 101 in the sheet shape and heating the protective component 101 in tight contact to bond the protective component 101 to the workpiece 1 as depicted in FIG. 7, FIG. 8, and FIG. 9.

In the protective component bonding step ST13, first, as depicted in FIG. 7, the workpiece 1 is placed on a support pedestal 32 set in a central region on the lower side in a vacuum chamber 31 of a protective component tight-contact apparatus 30, with the side of the front surface 4 oriented upward. In the protective component bonding step ST13, next, the one surface 103 of the sheet-shaped protective component 101 is oriented downward, and both ends of the protective component 101 are inserted into a pair of through-holes 33 formed on lateral sides of the vacuum chamber 31 to sandwich the support pedestal 32 and are pulled from the outside of the vacuum chamber 31 by a predetermined force. In this manner, in the protective component bonding step ST13, the sheet-shaped protective component 101 is disposed to cover the upper side of the front surface 4, with the one surface 103 oriented toward the side of the front surface 4 of the workpiece 1 on the support pedestal 32.

In the protective component bonding step ST13, after the sheet-shaped protective component 101 is disposed above the workpiece 1, as depicted in FIG. 7, the inside of the vacuum chamber 31 is evacuated to reduce the pressure from a first communication path 34 disposed in a central region on the upper side of the vacuum chamber 31 and a second communication path 35 disposed outside relative to the support pedestal 32 on the lower side of the vacuum chamber 31. In the protective component bonding step ST13, by this pressure reduction treatment, entry of air between the front surface 4 of the workpiece 1 and the one surface 103 of the protective component 101 is reduced and prevented. In the protective component bonding step ST13, in the first embodiment, the pressure of the inside of the vacuum chamber 31 is reduced to a low vacuum at approximately $10^5$ Pa to $10^1$ Pa by a dry pump, an oil rotary pump, or the like disposed to communicate with the first communication path 34 and the second communication path 35, for example.

In the protective component bonding step ST13, after the inside of the vacuum chamber 31 is evacuated to reduce the pressure from the first communication path 34 and the second communication path 35, as depicted in FIG. 8, a gas is introduced from the first communication path 34 into the vacuum chamber 31 in the state in which the evacuation from the second communication path 35 is continued. In the protective component bonding step ST13, by setting the gas pressure of the upper side of the protective component 101 higher than the gas pressure of the lower side of the protective component 101 as described above, the one surface 103 of the sheet-shaped protective component 101 is brought into tight contact with the front surface 4 of the workpiece 1 that exists under the protective component 101 as depicted in FIG. 8.

In the protective component bonding step ST13, a positional relation between the sheet-shaped protective component 101 and the workpiece 1 in the upward-downward direction may be switched, and the workpiece 1 may be pressed from the upper side to bring the front surface 4 of the workpiece 1 into tight contact with the one surface 103 of the sheet-shaped protective component 101 that exists under the workpiece 1.

Furthermore, in the protective component bonding step ST13, the support pedestal 32 that supports the workpiece 1 may be raised to bring the front surface 4 of the workpiece 1 into tight contact with the one surface 103 of the sheet-shaped protective component 101 that exists over the workpiece 1. In this case, it is preferable that the side of the other surface 104 of the sheet-shaped protective component 101 is held down from the upper side by a support surface of a predetermined support component. Furthermore, respective heat sources similar to heat sources 42 and 52 to be described later may be disposed inside the support pedestal 32 that supports the workpiece 1 and inside the support component that supports the side of the other surface 104 of the sheet-shaped protective component 101.

In the protective component bonding step ST13, after the front surface 4 of the workpiece 1 is brought into tight contact with the one surface 103 of the protective component 101, the protective component 101 and the workpiece 1 are taken out from the inside of the vacuum chamber 31 of the protective component tight-contact apparatus 30. Then, as depicted in FIG. 9, the workpiece 1 is placed in such a manner that the side of the back surface 7, which is the other surface side of the workpiece 1, is oriented toward a holding surface 41 of a suction holding table 40, and is sucked and held. Here, the suction holding table 40 includes a holding part 43 in which the holding surface 41 is disposed and that is formed of porous ceramic or the like. The suction holding table 40 is connected to a vacuum suction source that is not depicted in the diagram, and sucks and holds the workpiece 1 by the holding surface 41 by being sucked by the vacuum suction source.

Then, in the protective component bonding step ST13, the protective component 101 is heated and softened from the side of the holding surface 41 through the workpiece 1 by the heat source 42 disposed inside the suction holding table 40. Furthermore, in the protective component bonding step ST13, as depicted in FIG. 9, a flat pressing surface 51 of a pressing component 50 similar to the pressing component 20 is made to approach the other surface 104 of the protective component 101 in tight contact with the front surface 4 of the workpiece 1 sucked and held by the suction holding table 40 and get contact with the other surface 104 from the opposite side to the side of the holding surface 41. Moreover, in the protective component bonding step ST13, the protective component 101 is heated and softened from the side of the pressing surface 51 by the heat source 52 disposed inside the pressing component 50. In the first embodiment, different components are employed as the pressing component 20 used in the protective component forming step ST12 and the pressing component 50 used in the protective component bonding step ST13. However, the configuration is not limited thereto in the present invention, and the same components may be used.

In the protective component bonding step ST13, while the protective component 101 is heated and softened by the heat sources 42 and 52 as above, the softened protective component 101 is pressed against the workpiece 1 by the pressing surface 51 made parallel to the holding surface 41 as depicted in FIG. 9. Thereby, the one surface 103 of the softened protective component 101 is bonded to the front surface 4 of the workpiece 1. In the protective component bonding step ST13, the holding surface 41 and the pressing surface 51 are both flat and are parallel to each other, and therefore, the protective component 101 is bonded to the workpiece 1 in such a manner that the other surface 104 that is the exposed surface of the protective component 101 and the back surface 7 of the workpiece 1 are parallel to each other.

Furthermore, in the protective component bonding step ST13, the softened protective component 101 is pressed against the electrode bumps 6 on the front surface 4 of the workpiece 1 and gets deformed, and the thermoplastic resin 100 that forms the protective component 101 is buried in each region between adjacent ones of the electrode bumps 6. Due to this, in the protective component bonding step ST13, the protective component 101 becomes a component that is thicker than the projections and recesses on the front surface 4 formed by the electrode bumps 6 and covers the front surface 4 of the workpiece 1 without discontinuity. In the protective component bonding step ST13, in the first embodiment, the thickness of the protective component 101 that covers the front surface 4 of the workpiece 1 can be adjusted by adjusting an amount of rising of the suction holding table 40 and an amount of lowering of the pressing component 50.

In the protective component bonding step ST13, it is preferable to heat and soften a region of the protective component 101 bonded to the workpiece 1 by the heat sources 42 and 52 in a limited manner. For this reason, it is preferable for the heat sources 42 and 52 to be disposed opposed to the region of the protective component 101 bonded to the workpiece 1 in a limited manner. In the first embodiment, the heat source 42 is disposed opposed to the region of the protective component 101 bonded to the workpiece 1 in a limited manner as depicted in FIG. 9.

In the protective component bonding step ST13, in the first embodiment, for example, pressurization is executed by the suction holding table 40 and the pressing component 50 while heating is executed by the heat sources 42 and 52 at 30° C. to 250° C. inclusive, preferably at 40° C. to 150° C. inclusive, to bond the protective component 101 to the workpiece 1.

In the first embodiment, the condition of heating of the protective component 101 when the protective component 101 is bonded to the workpiece 1 in the protective component bonding step ST13 is different from the condition of heating of the thermoplastic resin 100 when the thermoplastic resin 100 is shaped in a sheet shape in the protective component forming step ST12. In the first embodiment, it is preferable that the heating temperature of the protective component 101 when the protective component 101 is bonded to the workpiece 1 in the protective component bonding step ST13 is lower than the heating temperature of the thermoplastic resin 100 when the thermoplastic resin 100 is shaped into a sheet shape in the protective component forming step ST12. Furthermore, in the first embodiment, it is preferable that the heating time of the protective component 101 when the protective component 101 is bonded to the workpiece 1 in the protective component bonding step ST13 is shorter than the heating time of the thermoplastic resin 100 when the thermoplastic resin 100 is shaped into a sheet shape in the protective component forming step ST12.

Moreover, in the first embodiment, it is preferable that an amount of pressing when the protective component 101 is bonded to the workpiece 1 in the protective component bonding step ST13 is smaller than an amount of pressing when the thermoplastic resin 100 is shaped into a sheet shape in the protective component forming step ST12. Here, the amount of pressing when the protective component 101 is bonded to the workpiece 1 in the protective component bonding step ST13 refers to a total amount of pressure per unit area that continues to be applied to the workpiece 1 (so-called impulse) when the protective component 101 is bonded to the workpiece 1 in the protective component bonding step ST13. Furthermore, the amount of pressing when the thermoplastic resin 100 is shaped into a sheet shape in the protective component forming step ST12 refers to a total amount of pressure per unit area that continues to be applied to the thermoplastic resin 100 and the protective component 101 (so-called impulse). Even when the same pressure is applied, the amount of pressing when the protective component 101 is bonded to the workpiece 1 in the protective component bonding step ST13 and the amount of pressing when the thermoplastic resin 100 is shaped into a sheet shape in the protective component forming step ST12 become smaller when the time for which the pressure is applied is shorter.

In the first embodiment, the heating temperature is lower, or the heating time is shorter, or the amount of pressing is smaller, when the protective component 101 is bonded to the workpiece 1 in the protective component bonding step ST13 than when the thermoplastic resin 100 is shaped into a sheet shape in the protective component forming step ST12. Thus, in the first embodiment, the heat or pressure applied to the workpiece 1 in the protective component bonding step ST13 can be suppressed, and alteration and damage to the semiconductor devices 5 can be suppressed. Furthermore, in the first embodiment, it is possible to suppress occurrence of a situation in which the protective component 101 gets deformed and extends around to the outer edge of the workpiece 1 in the protective component bonding step ST13 and thereby hinders processing at the time of processing of the workpiece 1.

The post-bonding cooling step ST14 is executed after the protective component bonding step ST13. The post-bonding cooling step ST14 is a step of cooling the protective component 101 heated in the protective component bonding step ST13.

In the first embodiment, by the post-bonding cooling step ST14, the thermoplastic resin 100 that forms the protective component 101 is cured immediately after the bonding to the workpiece 1. Therefore, the shape of the protective component 101 can be stabilized. In the post-bonding cooling step ST14, in the first embodiment, the cooling of the protective component 101 is started by turning off the heat sources 42 and 52 to stop the heating of the protective component 101 by the heat sources 42 and 52, for example, and the protective component 101 is cooled to approximately the temperature of the atmospheric air by the atmospheric air, for example.

The post-bonding cooling step ST14 is not limited thereto in the present invention. After the heat sources 42 and 52 are turned off, in the state in which the protective component 101 is pressurized by the pressing component 50, the protective component 101 may be cooled from the side of the holding surface 41 and the side of the pressing surface 51 by a cooling mechanism of air cooling, water cooling, or the like that is disposed inside each of the suction holding table 40 and the pressing component 50 and is not depicted in the diagram. Furthermore, in the post-bonding cooling step ST14, the heating of the protective component 101 by the heat source 52 may be stopped by separating the pressing component 50 from the protective component 101 instead of turning off the heat source 52. The post-bonding cooling step ST14 can be changed as appropriate according to whether or not the heat sources 42 and 52 are each used for heating and softening of the protective component 101 in the protective component bonding step ST13.

After the post-bonding cooling step ST14, the pressing component 50 is separated from the protective component 101, and the workpiece 1 to which the protective component 101 is bonded is detached from the suction holding table 40.

Figure 10:
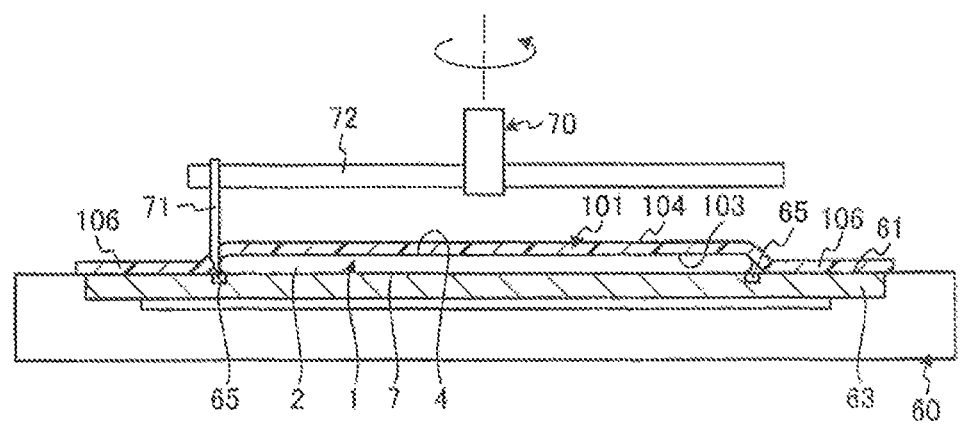
FIG. 10 is a sectional view for explaining a protective component cutting step executed after a post-bonding cooling step in FIG. 2.

FIG. 10 is a sectional view for explaining a protective component cutting step executed after the post-bonding cooling step ST14 in FIG. 2. In FIG. 10, the electrode bumps 6 are omitted. It is preferable for the setting method of a protective component according to the first embodiment to further include the protective component cutting step of cutting off a peripheral region 106 of the protective component 101 around the outer circumference of the workpiece 1 as depicted in FIG. 10. The protective component cutting step is executed after the post-bonding cooling step ST14.

In the protective component cutting step, first, as depicted in FIG. 10, the side of the back surface 7 of the workpiece 1 to which the protective component 101 is bonded is sucked and held by a holding surface 61 of a suction holding table 60. Here, the suction holding table 60 is what is obtained by removing the heat source 42 and changing the holding part 43 to a holding part 63 in the suction holding table 40. In the holding part 63, a circular annular groove 65 having the same diameter as the outer diameter of the workpiece 1 is formed on the side of the holding surface 61.

In the protective component cutting step, next, the peripheral region 106 that is the part protruding from the outer edge of the workpiece 1 in the radial direction in the protective component 101 formed on the workpiece 1 held by the holding surface 61 of the suction holding table 60 is cut off by a cutter 71 of a cutting-off apparatus 70. Here, the cutting-off apparatus 70 includes a circular plate 72 that holds the cutter 71 toward the outer edge of the workpiece 1, and a rotational drive source that rotationally drives the circular plate 72 around the axis center and is not depicted in the diagram. By rotating the circular plate 72 around the axis center by the rotational drive source in the state in which a cutting edge of the cutter 71 is inserted in the groove 65, the cutting-off apparatus 70 rotationally moves the cutter 71 along the outer edge of the workpiece 1 to cut off the peripheral region 106. In the protective component cutting step, the workpiece 1 to which the protective component 101 is bonded in such a manner as to cover the whole of the front surface 4 is obtained in this manner.

Figure 11:
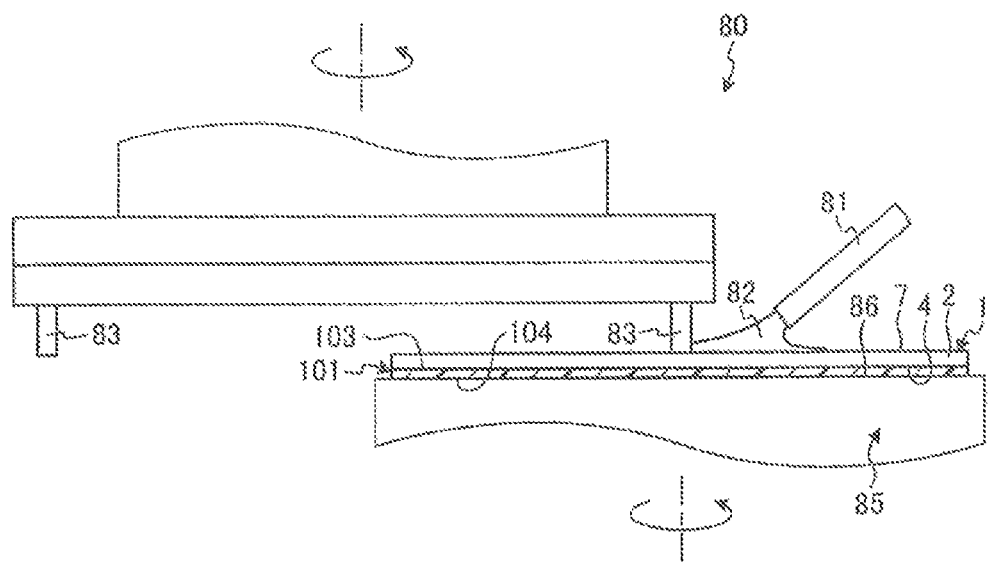
FIG. 11 is a sectional view depicting grinding processing that is one example of the processing method of a workpiece according to the first embodiment.

Next, the processing method of a workpiece according to the first embodiment will be described. FIG. 11 is a sectional view depicting grinding processing that is one example of the processing method of a workpiece according to the first embodiment. In FIG. 11, the electrode bumps 6 are omitted. The processing method of a workpiece according to the first embodiment is a method in which, as depicted in FIG. 11, the side (side of the other surface 104) of the protective component 101 of the workpiece 1 having the protective component 101 bonded to the front surface 4 thereof by the setting method of a protective component according to the first embodiment is sucked and held by a holding surface 86 of a chuck table 85 of a grinding apparatus 80 and grinding processing of the workpiece 1 is executed from the side of the back surface 7.

In the processing method of a workpiece according to the first embodiment, specifically, as depicted in FIG. 11, with rotation of the chuck table 85 that holds the workpiece 1 on the side of the protective component 101 around the axis center by a rotational drive source that is not depicted in the diagram, grinding abrasive stones 83 mounted on the grinding apparatus 80 are rotated around the axis center and are brought into contact with the back surface 7 of the workpiece 1 to execute grinding while a grinding liquid 82 is supplied from a grinding liquid supply part 81 of the grinding apparatus 80 to the back surface 7 of the workpiece 1.

In the setting method of a protective component according to the first embodiment, the protective component 101 in which adhesiveness like that of an adhesive is not almost observed substantially and that has nature that it is solidified by being cooled and does not have adhesiveness substantially, differently from an adhesive layer used for an adhesive tape, is bonded to the workpiece 1. Therefore, the setting method provides an advantageous effect that part of the protective component 101 is not left on the workpiece 1 as a residual when the protective component 101 is separated from the workpiece 1. Furthermore, in the setting method of a protective component according to the first embodiment, because the protective component 101 having the above-described nature is bonded to the workpiece 1, occurrence of a situation in which the protective component 101 works as a cushion in processing is suppressed. Therefore, the setting method provides an advantageous effect that it is possible to reduce the possibility of occurrence of a phenomenon in which the workpiece 1 breaks due to execution of processing treatment. Moreover, the manufacturing method of a protective component according to the first embodiment manufactures the protective component 101 having the above-described nature. Therefore, the manufacturing method provides the same advantageous effect as the above-described setting method of a protective component according to the first embodiment through bonding of the protective component 101 to the workpiece 1.

Furthermore, in the setting method of a protective component according to the first embodiment, the heating temperature is lower, or the heating time is shorter, or the amount of pressing is smaller when the protective component 101 is bonded to the workpiece 1 in the protective component bonding step ST13 than when the thermoplastic resin 100 is shaped into a sheet shape in the protective component forming step ST12. Thus, the setting method of a protective component according to the first embodiment provides an advantageous effect that the heat or pressure applied to the workpiece 1 in the protective component bonding step ST13 can be suppressed. In addition, the setting method of a protective component according to the first embodiment provides an advantageous effect that it is possible to suppress the occurrence of the situation in which the protective component 101 gets deformed and extends around to the outer edge of the workpiece 1 in the protective component bonding step ST13.

Moreover, in the setting method of a protective component according to the first embodiment, the protective component forming step ST12 includes the post-shaping cooling step of cooling the protective component 101 shaped into a sheet shape. Thus, in the setting method of a protective component according to the first embodiment, the thermoplastic resin 100 that forms the protective component 101 is cured immediately after the shaping into the sheet shape. Accordingly, the setting method provides an advantageous effect that the shape of the protective component 101 can be rapidly stabilized. In addition, the manufacturing method of a protective component according to the first embodiment provides an advantageous effect that the protective component 101 whose shape is rapidly stabilized as above can be manufactured.

Furthermore, in the setting method of a protective component according to the first embodiment, in the protective component forming step ST12, the thermoplastic resin 100 is shaped into the protective component 101 in a sheet shape with such a size as to cover the front surface 4 of the workpiece 1 without discontinuity. Thus, the setting method of a protective component according to the first embodiment provides an advantageous effect that the front surface 4 of the workpiece 1 can be protected by the protective component 101 over the whole surface without discontinuity and the workpiece 1 can be fixed more strongly in a flat state on the side of the protective component 101.

Moreover, in the setting method of a protective component according to the first embodiment, in the protective component forming step ST12, the thermoplastic resin 100 is pressed and spread by the pressing surface 21 that is parallel to the support surface 11 and is flat. Thus, the setting method of a protective component according to the first embodiment bonds the sheet-shaped protective component 101 in which the one surface 103 and the other surface 104 are both flat and are parallel to each other to the workpiece 1 and therefore, can allow the height of the upper surface of the workpiece 1 to be constant regardless of variation in the thickness of the workpiece 1. In addition, the setting method of a protective component according to the first embodiment provides an advantageous effect that the workpiece 1 can be fixed more strongly in a flat state on the side of the protective component 101 when being held by the flat chuck table 85.

Furthermore, in the setting method of a protective component according to the first embodiment, the front surface 4 of the workpiece 1 has structural objects including the projections and recesses, and the thickness of the sheet-shaped protective component 101 shaped in the protective component forming step ST12 is formed thicker than the height of the projections and recesses. Thus, the setting method of a protective component according to the first embodiment provides an advantageous effect that the structural objects including the projections and recesses on the front surface 4 of the workpiece 1 can be covered and protected by the protective component 101 over the whole surface without discontinuity and the workpiece 1 can be fixed more strongly in a flat state on the side of the protective component 101.

Moreover, in the setting method of a protective component according to the first embodiment, the workpiece 1 is a semiconductor wafer having the semiconductor devices 5 on the front surface 4. Thus, the setting method of a protective component according to the first embodiment provides an advantageous effect that, due to the setting of the protective component 101, the front surface of the semiconductor devices 5 is favorably protected and part of the protective component 101 is not left on the semiconductor devices 5 as a residual when the protective component 101 is separated from the semiconductor devices 5.

Furthermore, in the setting method of a protective component according to the first embodiment, it is possible to set, on the workpiece 1, the protective component 101 formed to a desired thickness according to an amount of supply of the thermoplastic resin 100 or the amount of pressing when the thermoplastic resin 100 is pressed and spread, differently from an adhesive tape used as a protective component conventionally. Therefore, the setting method provides an advantageous effect that the protective component 101 with an optional thickness can be manufactured with the minimum thermoplastic resin 100 and cost reduction is achieved compared with the case in which plural adhesive tapes are possessed for each thickness.

The processing method of a workpiece according to the first embodiment is a method in which the side of the protective component 101 of the workpiece 1 for which the protective component 101 has been bonded to the front surface 4 by the setting method of a protective component according to the first embodiment is sucked and held by the holding surface 86 of the chuck table 85 and the workpiece 1 is processed from the side of the back surface 7, which is the other surface side. Thus, the processing method of a workpiece according to the first embodiment is the same as the above-described setting method of a protective component according to the first embodiment in that the protective component 101 is bonded to the front surface 4 of the workpiece 1 and therefore, provides the same advantageous effect as the above-described setting method of a protective component according to the first embodiment. This allows the processing method of a workpiece according to the first embodiment to provide the following advantageous effect. The workpiece 1 can be fixed more strongly in a flat state on the side of the protective component 101 while the protective component 101 is brought into tight contact with the shape of the front surface 4 including the projections and recesses, and so forth. Furthermore, because there is no glue layer, the occurrence of the situation in which the protective component 101 works as a cushion in processing is suppressed. This can reduce the possibility of the occurrence of the phenomenon in which the workpiece 1 breaks due to execution of processing treatment and therefore, allows the side of the back surface 7 of the workpiece 1 to be accurately processed.

Second Embodiment

Figure 12:
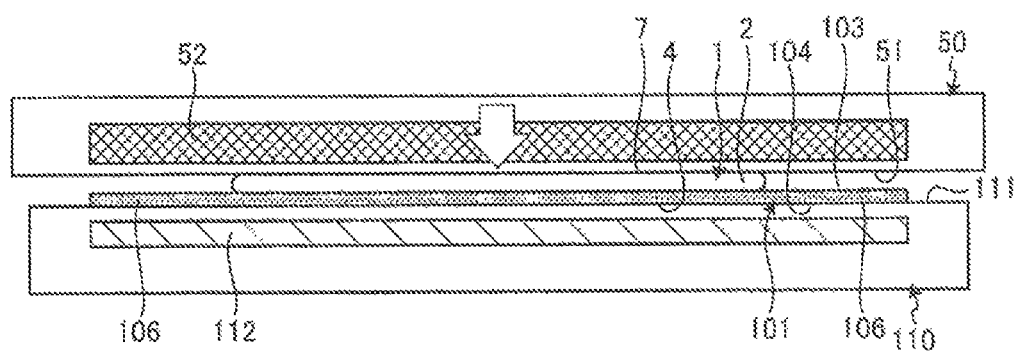
FIG. 12 is a sectional view for explaining a setting method of a protective component according to a second embodiment.

A setting method of a protective component according to a second embodiment of the present invention will be described based on a drawing. FIG. 12 is a sectional view for explaining the setting method of a protective component according to the second embodiment. In FIG. 12, the electrode bumps 6 are omitted. The same parts as the first embodiment are given the same numerals in FIG. 12, and description thereof is omitted.

The setting method of a protective component according to the second embodiment is a method obtained by changing the protective component bonding step ST13 in the setting method of a protective component according to the first embodiment. In the protective component bonding step ST13 according to the second embodiment, the same process as the first embodiment is executed until the one surface 103 of the sheet-shaped protective component 101 is brought into tight contact with the front surface 4 of the workpiece 1.

In the protective component bonding step ST13 according to the second embodiment, after the protective component 101 and the workpiece 1 brought into tight contact with each other are taken out from the inside of the vacuum chamber 31 of the protective component tight-contact apparatus 30, the protective component 101 is placed in such a manner that the side of the other surface 104 of the protective component 101 is oriented toward a support surface 111 of a support table 110 similar to the support table 10 as depicted in FIG. 12.

Then, in the protective component bonding step ST13 according to the second embodiment, the protective component 101 is heated and softened from the side of the support surface 111 by a heat source 112 disposed inside the support table 110. Furthermore, in the protective component bonding step ST13 according to the second embodiment, the flat pressing surface 51 of the pressing component 50 is made to approach the back surface 7 of the workpiece 1 with which the one surface 103 of the protective component 101 supported by the support table 110 is in tight contact and get contact with the back surface 7 from the opposite side to the side of the support surface 111 as depicted in FIG. 12. Moreover, in the protective component bonding step ST13 according to the second embodiment, the protective component 101 is heated and softened from the side of the pressing surface 51 through the workpiece 1 by the heat source 52 disposed inside the pressing component 50. Thereafter, in the protective component bonding step ST13 according to the second embodiment, the front surface 4 of the workpiece 1 is bonded to the one surface 103 of the softened protective component 101 by pressing the workpiece 1 against the softened protective component 101 by the pressing surface 51 made parallel to the support surface 111 as depicted in FIG. 12.

In the protective component bonding step ST13 according to the second embodiment, as above, in the protective component bonding step ST13 according to the first embodiment, the one surface 103 of the protective component 101 is bonded to the front surface 4 of the workpiece 1 in the state in which the positional relation in the upward-downward direction between the workpiece 1 and the protective component 101 in tight contact with each other is switched.

The setting method of a protective component according to the second embodiment having the above configuration is a method in which the protective component 101 is bonded to the workpiece 1 with switching of the positional relation in the upward-downward direction between the workpiece 1 and the protective component 101 in tight contact with each other in the setting method of a protective component according to the first embodiment. Therefore, the setting method of a protective component according to the second embodiment provides the same advantageous effect as the setting method of a protective component according to the first embodiment.

First Modification Example

Figure 13:
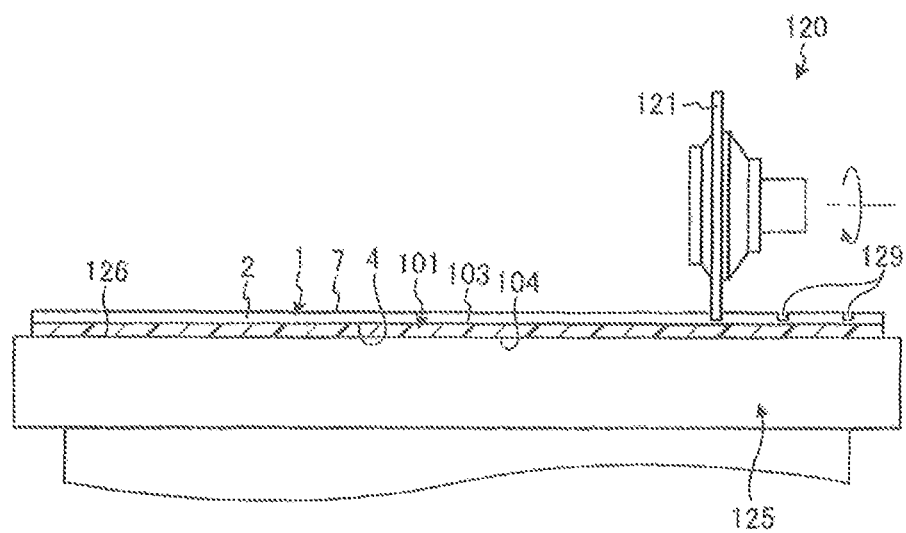
FIG. 13 is a sectional view depicting cutting processing that is one example of a processing method of a workpiece according to a first modification example.
Figure 14:
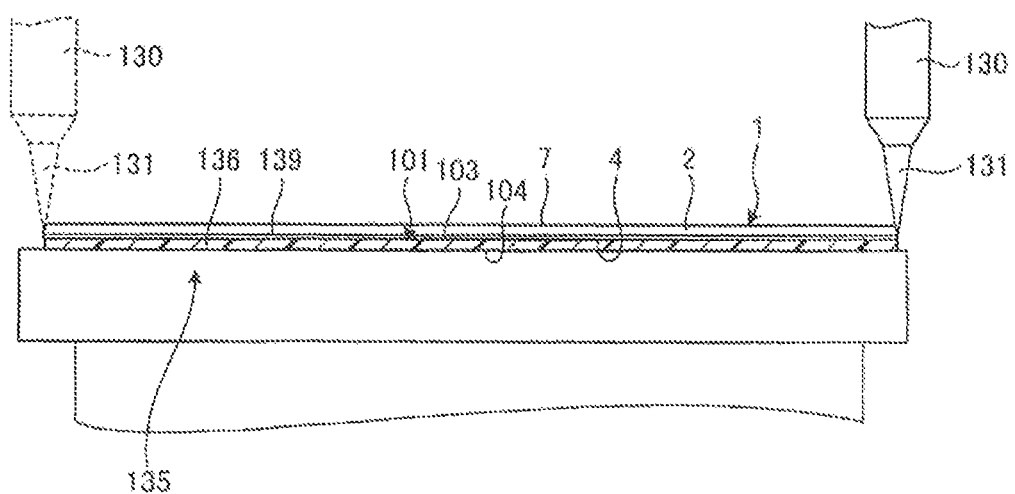
FIG. 14 is a sectional view depicting laser processing that is one example of the processing method of a workpiece according to the first modification example.

A processing method of a workpiece according to a first modification example of the first embodiment of the present invention will be described based on drawings. FIG. 13 is a sectional view depicting cutting processing that is one example of the processing method of a workpiece according to the first modification example. FIG. 14 is a sectional view depicting laser processing that is one example of the processing method of a workpiece according to the first modification example. In FIG. 13 and FIG. 14, the electrode bumps 6 are omitted. The same parts as the first embodiment are given the same numerals in FIG. 13 and FIG. 14, and description thereof is omitted.

A first example of the processing method of a workpiece according to the first modification example is a modification example of the grinding processing according to the first embodiment depicted in FIG. 11 and is a method in which the workpiece 1 is thinned in such a manner that the side end part at the outermost circumference of the workpiece 1 is left and only the inside thereof is ground from the side of the back surface 7 by the grinding abrasive stones 83 of the grinding apparatus 80. That is, the first example is a method in which so-called TAIKO (registered trademark) grinding of the workpiece 1 is executed from the side of the back surface 7.

A second example of the processing method of a workpiece according to the first modification example is the following method. As depicted in FIG. 13, the workpiece 1 is held on the side of the protective component 101 by a holding surface 126 of a chuck table 125. In this state, while a cutting liquid is supplied to the back surface 7 of the workpiece 1, a cutting blade 121 mounted on cutting apparatus 120 is rotated around the axis center and processing feed, indexing feed, and cutting-in feed of the chuck table 125 or the cutting blade 121 of the cutting apparatus 120 are executed by a drive source that is not depicted in the diagram. Thereby, the workpiece 1 is cut from the side of the back surface 7. In the second example of the processing method of a workpiece according to the first modification example, for example, the workpiece 1 is half-cut or the workpiece 1 is divided (fully cut) into the semiconductor devices 5 by cutting the workpiece 1 along the planned dividing lines 3 from the side of the back surface 7 and forming cut grooves 129.

A third example of the processing method of a workpiece according to the first modification example is a method in which, as depicted in FIG. 14, laser processing of the workpiece 1 is executed from the side of the back surface 7 by irradiating the back surface 7 of the workpiece 1 held on the side of the protective component 101 by a holding surface 136 of a chuck table 135 with a laser beam 131 from a laser irradiation apparatus 130. In the third example of the processing method of a workpiece according to the first modification example, the pulsed laser beam 131 may be used. In the third example of the processing method of a workpiece according to the first modification example, for example, laser-processed grooves 139 are formed by irradiating the workpiece 1 with the laser beam 131 from the side of the back surface 7 along the planned dividing lines 3. In the third example of the processing method of a workpiece according to the first modification example, by executing so-called ablation processing, the workpiece 1 may be half-cut or be divided into the semiconductor devices 5, or a modified layer may be formed inside. In the third example of the processing method of a workpiece according to the first modification example, the protective component 101 is in tight contact with the device surfaces, and therefore, adhesion of debris generated in the ablation processing to the workpiece 1 (semiconductor devices 5 and bumps 6) is suppressed.

In the processing method of a workpiece according to the first modification example, in the cutting processing of the second example or the laser processing of the third example, the semiconductor device 5 on the side of the front surface 4 may be photographed from the side of the back surface 7 of the workpiece 1 by using an infrared camera, and the planned dividing line 3 that is a region to be processed may be identified. Furthermore, in the processing method of a workpiece according to the first modification example, in the cutting processing of the second example or the laser processing of the third example, the workpiece 1 may be held by using the chuck table 125 or 135 having translucency, such as glass, and the semiconductor device 5 on the side of the front surface 4 of the workpiece 1 may be photographed through the chuck table 125 or 135 and through the protective component 101 to identify the planned dividing line 3.

The second example and the third example of the processing method of a workpiece according to the first modification example are not limited to the form in which the side of the protective component 101 set on the front surface 4 of the workpiece 1 is sucked and held by the holding surface 126 or 136 of the chuck table 125 or 135 and cutting processing or laser processing of the workpiece 1 is executed from the side of the back surface 7. The side of the protective component 101 set on the back surface 7 of the workpiece 1 may be sucked and held by the holding surface 126 or 136 of the chuck table 125 or 135, and cutting processing or laser processing of the workpiece 1 may be executed from the side of the front surface 4.

The processing method of a workpiece according to the first modification example having the above configuration is the method in which the side of the protective component 101 of the workpiece 1 for which the protective component 101 has been bonded to the front surface 4 by the setting method of a protective component according to the first embodiment is sucked and held by the holding surface 86, 126, or 136 of the chuck table 85, 125, or 135 and the workpiece 1 is processed from the side of the back surface 7, which is the other surface side, similarly to the processing method of a workpiece according to the first embodiment. Therefore, the processing method of a workpiece according to the first modification example provides the same advantageous effect as the processing method of a workpiece according to the first embodiment.

Furthermore, the processing method of a workpiece according to the first modification example provides the following advantageous effect in the case of photographing the semiconductor device 5 on the side of the front surface 4 of the workpiece 1 through the chuck table 125 or 135 having translucency and identifying the planned dividing line 3 in the cutting processing of the second example or the laser processing of the third example. Specifically, because the protective component 101 has translucency, differently from a semitransparent adhesive layer used for an adhesive tape, the semiconductor device 5 can be clearly photographed from the side of the front surface 4 of the workpiece 1 through the protective component 101, and the planned dividing line 3 can be accurately identified compared with the conventional case in which the adhesive tape is used.

Moreover, the third example of the processing method of a workpiece according to the first modification example is not limited to the form in which irradiation with the laser beam 131 is executed from the side of the back surface 7 of the workpiece 1 and laser processing is executed in the present invention. By executing irradiation with a predetermined laser beam through the protective component 101 from the side of the front surface 4 on which the protective component 101 is set for the workpiece 1 for which the setting method of a protective component according to the first embodiment has been executed, the laser-processed grooves 139 may be formed, or a modified layer may be formed inside through ablation processing of the workpiece 1. The third example of the processing method of a workpiece according to the first modification example provides the following advantageous effect in the case of executing the ablation processing through the protective component 101 as above. Specifically, because the protective component 101 has translucency differently from a semitransparent adhesive layer used for an adhesive tape, the semiconductor device 5 can be clearly photographed from the side of the front surface 4 of the workpiece 1 through the protective component 101, and the planned dividing line 3 can be accurately identified, compared with the conventional case in which the adhesive tape is used. Moreover, particularly in the case of executing ablation processing for the device surfaces of the semiconductor devices 5, the third example of the processing method of a workpiece according to the first modification example provides an advantageous effect that adhesion of debris generated in the ablation processing to the workpiece 1 (semiconductor devices 5 and bumps 6) is suppressed because the protective component 101 is in tight contact with the device surfaces.

Furthermore, the protective component 101 set on the workpiece 1 by the setting method of a protective component according to the first embodiment protects the semiconductor devices 5 on the side of the front surface 4 also in execution of any processing of grinding, cutting (dicing), and laser processing from the side of the back surface 7 of the workpiece 1 as described in each of the first embodiment and the first modification example. Thus, the setting method of a protective component and the manufacturing method of a protective component according to the first embodiment and the processing method of a workpiece according to the first modification example provide also the following advantageous effect. Specifically, due to the setting of the protective component 101 on the side of the front surface 4 of the workpiece 1 on which the semiconductor devices 5 are formed, it is also possible to execute cutting or laser processing continuously with grinding once the protective component 101 is set in the case of executing the grinding and the cutting or laser processing from the side of the back surface 7 of the workpiece 1. Therefore, the need to re-stick the protective component 101 is eliminated. In the setting method of a protective component and the manufacturing method of a protective component according to the first embodiment and the processing method of a workpiece according to the first modification example, it is more effective to make the cutting blade 121 cut into the workpiece 1 from the surface on the opposite side to the device surfaces and cut off the workpiece 1 because breakage (chipping) becomes smaller, particularly when the workpiece 1 is a device wafer obtained by forming the semiconductor devices 5 on an SiC substrate.

Third Embodiment

Figure 15:
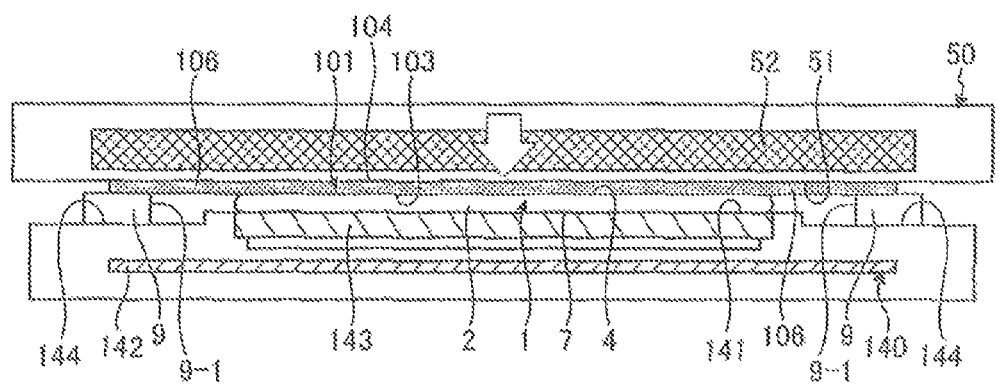
FIG. 15 is a sectional view for explaining a setting method of a protective component according to a third embodiment.
Figure 16:
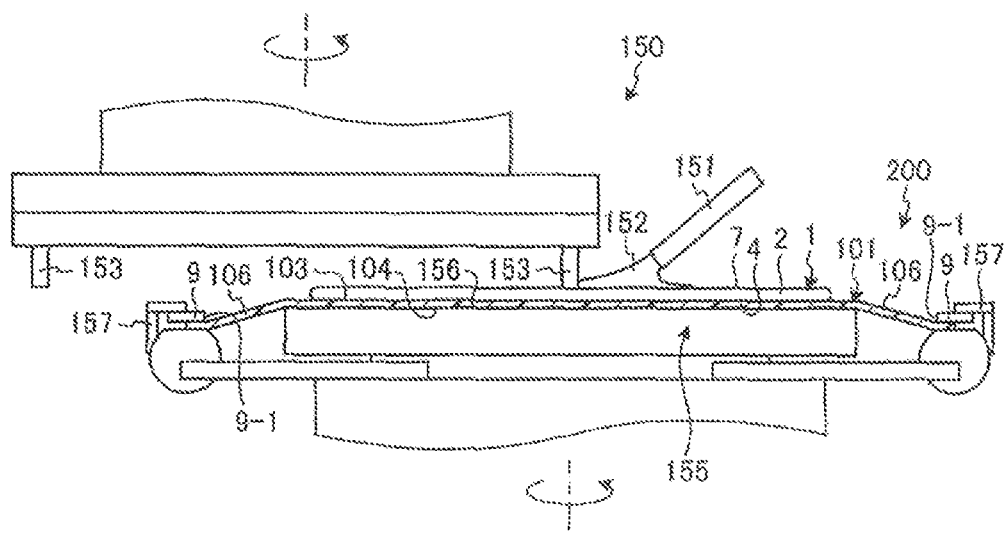
FIG. 16 is a sectional view depicting grinding processing that is one example of a processing method of a workpiece according to the third embodiment.

A setting method of a protective component and a processing method of a workpiece according to a third embodiment of the present invention will be described based on drawings. FIG. 15 is a sectional view for explaining the setting method of a protective component according to the third embodiment. FIG. 16 is a sectional view depicting grinding processing that is one example of the processing method of a workpiece according to the third embodiment. In FIG. 15 and FIG. 16, the electrode bumps 6 are omitted. The same parts as the first embodiment are given the same numerals in FIG. 15 and FIG. 16 and description thereof is omitted.

The setting method of a protective component according to the third embodiment is a method obtained by changing the protective component bonding step ST13 in the setting method of a protective component according to the first embodiment. In the protective component bonding step ST13 according to the third embodiment, as depicted in FIG. 15, the peripheral region 106 of the protective component 101 around the outer circumference of the workpiece 1 is bonded to an annular frame 9 that surrounds the workpiece 1, and a frame unit 200 (see FIG. 16) in which the workpiece 1 is fixed in an opening 9-1 of the annular frame 9 through the protective component 101 is formed. Here, the inner diameter of the annular frame 9 is larger than the outer diameter of the workpiece 1.

In the protective component bonding step ST13 according to the third embodiment, the same process as the first embodiment is executed until the one surface 103 of the sheet-shaped protective component 101 is brought into tight contact with the front surface 4 of the workpiece 1.

In the protective component bonding step ST13 according to the third embodiment, as depicted in FIG. 15, the annular frame 9 is placed on a frame placement part 144 formed to hollow into a circular annular shape in a region at the outer circumference of a holding surface 141 of a suction holding table 140. In the protective component bonding step ST13 according to the third embodiment, after the annular frame 9 is placed on the frame placement part 144, the protective component 101 and the workpiece 1 brought into tight contact with each other are placed over the holding surface 141 of the suction holding table 140, with the side of the workpiece 1 oriented downward, and are sucked and held. The suction holding table 140 includes a holding part 143 similar to the suction holding table 40 and sucks and holds the workpiece 1 by the holding surface 141 by a mechanism similar to the suction holding table 40. In the protective component bonding step ST13 according to the third embodiment, the peripheral region 106 of the protective component 101 is placed on the annular frame 9 by sucking and holding the workpiece 1 by the holding surface 141.

In the protective component bonding step ST13 according to the third embodiment, a bonding promoting component that promotes bonding of the thermoplastic resin 100 to the annular frame 9 may be disposed between the annular frame 9 and the peripheral region 106 of the protective component 101. Furthermore, the bonding promoting component may be disposed on the annular frame 9. Here, the bonding promoting component is formed of a material that promotes a bonding reaction that occurs between the annular frame 9 and the thermoplastic resin 100.

In the protective component bonding step ST13 according to the third embodiment, after the annular frame 9 and the protective component 101 and the workpiece 1 brought into tight contact with each other are placed over the suction holding table 140, similarly to the first embodiment, the one surface 103 of the softened protective component 101 is bonded to the front surface 4 of the workpiece 1 and the annular frame 9 by pressing the softened protective component 101 against the workpiece 1 and the annular frame 9 by the pressing surface 51 made parallel to the holding surface 141 while heating and softening the protective component 101 by the heat source 52 and a heat source 142 of the suction holding table 140. Thereafter, in the protective component bonding step ST13 according to the third embodiment, the protective component 101 is cooled, and the frame unit 200 in which the workpiece 1 is fixed in the opening 9-1 of the annular frame 9 through the protective component 101 is obtained. In the protective component bonding step ST13 according to the third embodiment, the heating temperature of the annular frame 9 may be set higher than the heating temperature of the workpiece 1, and the annular frame 9 may be firmly fixed to the protective component 101.

In the protective component bonding step ST13 according to the third embodiment, the regions each bonded to the workpiece 1 and the annular frame 9 in the protective component 101 are heated and softened by the heat sources 142 and 52. For this reason, it is preferable for the heat sources 142 and 52 to be disposed opposed to each other over the regions each bonded to the workpiece 1 and the annular frame 9 in the protective component 101. In the third embodiment, the heat sources 142 and 52 are disposed opposed to each other over the regions each bonded to the workpiece 1 and the annular frame 9 in the protective component 101, as depicted in FIG. 15.

In the processing method of a workpiece according to the third embodiment, as depicted in FIG. 16, in the state in which the annular frame 9 of the frame unit 200 is gripped by clamps 157 and the side of the protective component 101 of the frame unit 200 is sucked and held by a holding surface 156 of a chuck table 155, with rotation of the chuck table 155 around the axis center by a rotational drive source that is not depicted in the diagram, grinding abrasive stones 153 mounted on a grinding apparatus 150 are rotated around the axis center and are brought into contact with the back surface 7 of the workpiece 1 to execute grinding while a grinding liquid 152 is supplied from a grinding liquid supply part 151 of the grinding apparatus 150 to the back surface 7 of the workpiece 1.

In the setting method of a protective component according to the third embodiment having the above configuration, in the protective component bonding step ST13, the peripheral region 106 of the protective component 101 around the outer circumference of the workpiece 1 is bonded to the annular frame 9 that surrounds the workpiece 1, and the frame unit 200 in which the workpiece 1 is fixed in the opening 9-1 of the annular frame 9 through the protective component 101 is formed. Thus, the setting method of a protective component according to the third embodiment provides an advantageous effect similar to that of the setting method of a protective component according to the first embodiment. Furthermore, in the setting method of a protective component according to the third embodiment, by utilizing treatment of bonding the protective component 101 to the workpiece 1, simultaneously the peripheral region 106 of the protective component 101 can be bonded to the annular frame 9, and the workpiece 1 can be fixed in the opening 9-1 of the annular frame 9. Therefore, the setting method provides an advantageous effect that labor and cost of fixing the workpiece 1 in the opening 9-1 of the annular frame 9 can be significantly reduced. In addition, in the setting method of a protective component according to the third embodiment, due to the fixing of the protective component 101 to the annular frame 9, deformation such as bending is suppressed, and therefore, damage to the workpiece 1 fixed to the protective component 101 is also suppressed.

Moreover, the processing method of a workpiece according to the third embodiment having the above configuration is a method obtained by changing an object to be processed to the frame unit 200 in the processing method of a workpiece according to the first embodiment, and therefore provides an advantageous effect similar to that of the processing method of a workpiece according to the first embodiment.

Fourth Embodiment

Figure 17:
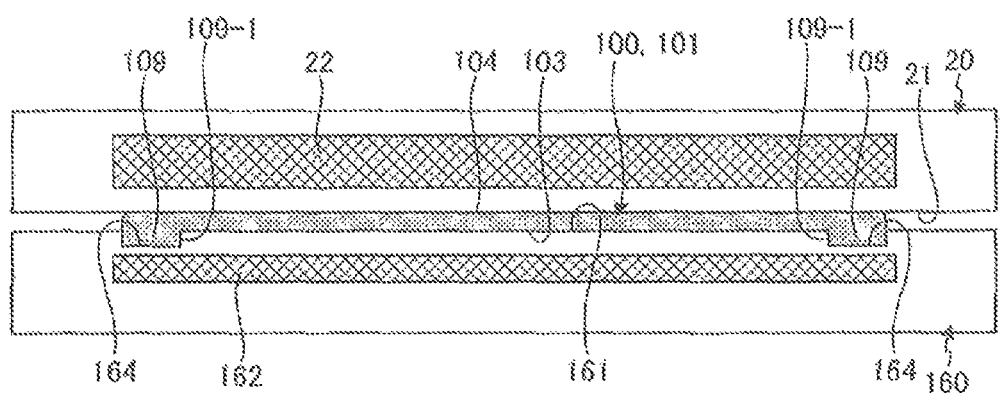
FIG. 17 is a sectional view for explaining a setting method of a protective component according to a fourth embodiment.
Figure 18:
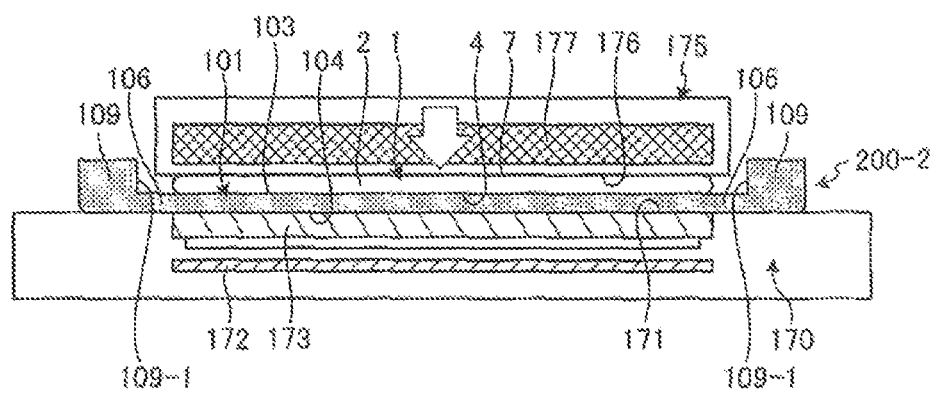
FIG. 18 is a sectional view for explaining the setting method of a protective component according to the fourth embodiment.

A setting method of a protective component, a manufacturing method of a protective component, and a processing method of a workpiece according to a fourth embodiment of the present invention will be described based on drawings. FIG. 17 and FIG. 18 are sectional views for explaining the setting method of a protective component according to the fourth embodiment. In FIG. 17 and FIG. 18, the electrode bumps 6 are omitted. The same parts as the first embodiment are given the same numerals in FIG. 17 and FIG. 18, and description thereof is omitted.

The setting method of a protective component according to the fourth embodiment is a method obtained by changing the resin supply step ST11, the protective component forming step ST12, and the protective component bonding step ST13 in the setting method of a protective component according to the first embodiment. Furthermore, the manufacturing method of a protective component according to the fourth embodiment is a method obtained by changing the resin supply step ST11 and the protective component forming step ST12 in the manufacturing method of a protective component according to the first embodiment.

In the resin supply step ST11 according to the fourth embodiment, as depicted in FIG. 17, the thermoplastic resin 100 is supplied to a flat support surface 161 of a support table 160 and a groove part 164 formed to hollow into a circular annular shape in a region at the outer circumference of the support surface 161. Here, the inner diameter of the groove part 164 is larger than the outer diameter of the workpiece 1.

In the protective component forming step ST12 according to the fourth embodiment, as depicted in FIG. 17, a thicker part 109 of the thermoplastic resin 100 is formed at the peripheral edge of the sheet-shaped protective component 101. Here, the thicker part 109 refers to a part thicker than the protective component 101. Specifically, the thicker part 109 is thicker than the protective component 101 by a thickness equivalent to that of the annular frame 9 of the third embodiment. In the protective component forming step ST12 according to the fourth embodiment, with heating and softening of the thermoplastic resin 100 by a heat source 162 disposed inside the support table 160 and the heat source 22 of the pressing component 20, the thermoplastic resin 100 in the groove part 164 is shaped to have a large thickness according to the groove part 164 while the thermoplastic resin 100 on the support surface 161 is pressed and spread along the support surface 161 to be shaped into a sheet shape by the pressing surface 21 made parallel to the support surface 161. Thereby, the protective component 101 of the sheet-shaped thermoplastic resin 100 including the thicker part 109 of the thermoplastic resin 100 at the peripheral edge is formed.

An annular frame core material may be supplied to the groove part 164 in the resin supply step ST11 according to the fourth embodiment, and the thicker part 109 may be formed by the annular frame core material and the thermoplastic resin 100 in the groove part 164 in the protective component bonding step ST13 according to the fourth embodiment. Here, the annular frame core material is a core material of which the diameter at the center in the radial direction is equal to that of the groove part 164 and the width in the radial direction and the thickness are smaller than those of the groove part 164.

The protective component bonding step ST13 according to the fourth embodiment is a step obtained by changing the object that is brought into tight contact with the front surface 4 of the workpiece 1 and is bonded to the front surface 4 to the protective component 101 with the thicker part 109 formed in the resin supply step ST11 and the protective component forming step ST12 according to the fourth embodiment in the protective component bonding step ST13 according to the first embodiment.

In the protective component bonding step ST13 according to the fourth embodiment, first, similarly to the first embodiment, the one surface 103 that is the surface on the protrusion side of the thicker part 109 in the sheet-shaped region of the protective component 101 with the thicker part 109 is brought into tight contact with the front surface 4 of the workpiece 1 in the vacuum chamber 31 of the protective component tight-contact apparatus 30, and the protective component 101 with the thicker part 109 and the workpiece 1 brought into tight contact with each other are taken out from the inside of the vacuum chamber 31 of the protective component tight-contact apparatus 30. That is, in the protective component bonding step ST13 according to the fourth embodiment, the one surface 103 that is the bottom surface of the recessed part of the protective component 101 with the thicker part 109, the recessed part being surrounded by the thicker part 109, is brought into tight contact with the front surface 4 of the workpiece 1.

In the protective component bonding step ST13 according to the fourth embodiment, as depicted in FIG. 18, the protective component 101 with the thicker part 109 and the workpiece 1 brought into tight contact with each other are placed over a holding surface 171 of a suction holding table 170, with the side of the protective component 101 with the thicker part 109 oriented downward, are sucked and held.

In the protective component bonding step ST13 according to the fourth embodiment, after the protective component 101 with the thicker part 109 and the workpiece 1 brought into tight contact with each other are placed over the suction holding table 170, similarly to the first embodiment, the one surface 103 of the softened protective component 101 with the thicker part 109 is bonded to the front surface 4 of the workpiece 1 by pressing the workpiece 1 against the softened protective component 101 with the thicker part 109 by a pressing surface 176 made parallel to the holding surface 171 while heating and softening the protective component 101 with the thicker part 109 by a heat source 177 of a pressing component 175 and a heat source 172 of the suction holding table 170. Here, the pressing component 175 is a component obtained by setting the width of the pressing component 50 in the radial direction smaller than the inner diameter of the bottom surface of the recessed part surrounded by the thicker part 109 of the protective component 101 with the thicker part 109. Thereafter, in the protective component bonding step ST13 according to the fourth embodiment, the protective component 101 is cooled, and a frame unit 200-2 in which the workpiece 1 is fixed in an opening 109-1 of the thicker part 109 through the protective component 101 is obtained. In the frame unit 200-2, the thicker part 109 functions as a reinforcing component that reinforces the workpiece 1 and the frame unit 200-2 similarly to the annular frame 9 in the frame unit 200.

In the protective component bonding step ST13 according to the fourth embodiment, the region bonded to the workpiece 1 in the protective component 101 with the thicker part 109 is heated and softened by the heat sources 172 and 177. Furthermore, in the protective component bonding step ST13 according to the fourth embodiment, it is preferable to suppress softening and deformation of the thicker part 109 of the protective component 101 with the thicker part 109 through heating thereof. For this reason, it is preferable for the heat sources 172 and 177 to be disposed in a limited manner opposed to the region bonded to the workpiece 1 in the protective component 101 with the thicker part 109. In the fourth embodiment, the heat sources 172 and 177 are disposed in a limited manner opposed to the region bonded to the workpiece 1 in the protective component 101 with the thicker part 109, as depicted in FIG. 18.

The processing method of a workpiece according to the fourth embodiment is a method obtained by changing an object to be processed to the frame unit 200-2 in the processing method of a workpiece according to the third embodiment.

In the setting method of a protective component according to the fourth embodiment having the above configuration, the thicker part 109 of the thermoplastic resin 100 is formed at the peripheral edge of the sheet-shaped protective component 101 in the protective component forming step ST12, and the workpiece 1 is bonded to the sheet-shaped region and the thicker part 109 functions as a reinforcing component in the protective component bonding step ST13. Thus, the setting method of a protective component according to the fourth embodiment is a method obtained by changing the annular frame 9 to the thicker part 109 in the setting method of a protective component according to the third embodiment and therefore, provides the same advantageous effect as the setting method of a protective component according to the third embodiment. Furthermore, the manufacturing method of a protective component according to the fourth embodiment manufactures the above-described protective component 101 with the thicker part 109 and therefore provides the same advantageous effect as the above-described setting method of a protective component according to the fourth embodiment through bonding to the workpiece 1.

Moreover, the processing method of a workpiece according to the fourth embodiment having the above configuration is a method obtained by changing an object to be processed to the frame unit 200-2 in the processing method of a workpiece according to the third embodiment and therefore, provides the same advantageous effect as the processing method of a workpiece according to the third embodiment.

Second Modification Example

Figure 19:
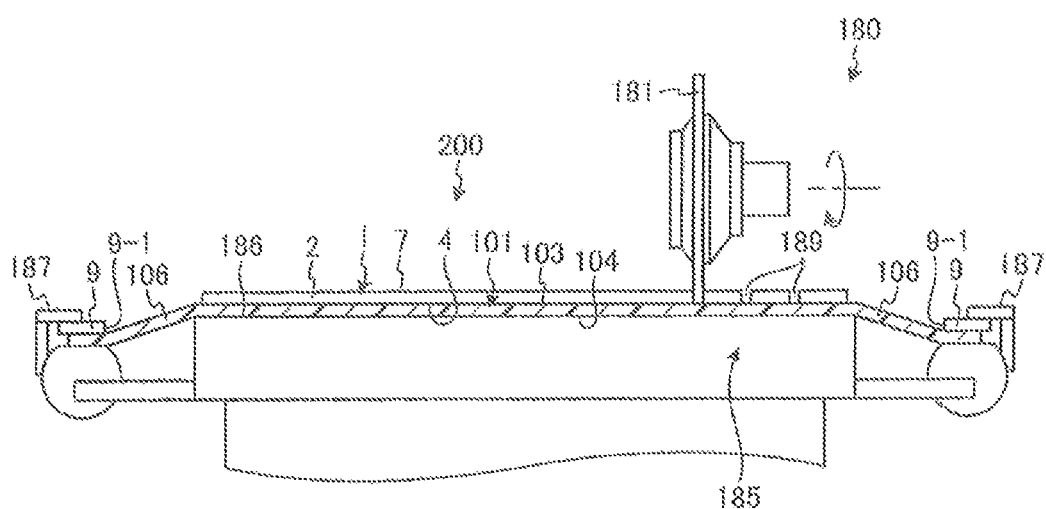
FIG. 19 is a sectional view depicting cutting processing that is one example of a processing method of a workpiece according to a second modification example.
Figure 20:
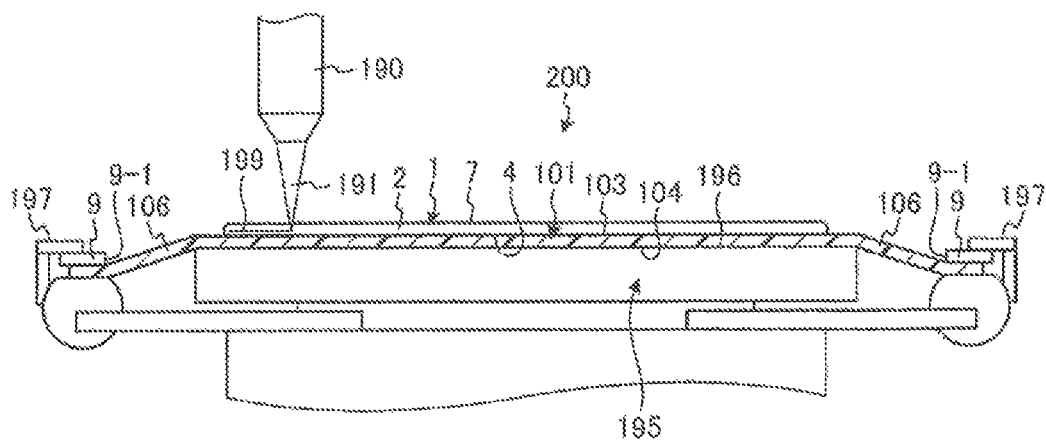
FIG. 20 is a sectional view depicting laser processing that is one example of the processing method of a workpiece according to the second modification example.

A processing method of a workpiece according to a second modification example of the third embodiment of the present invention will be described based on drawings. FIG. 19 is a sectional view depicting cutting processing that is one example of the processing method of a workpiece according to the second modification example. FIG. 20 is a sectional view depicting laser processing that is one example of the processing method of a workpiece according to the second modification example. In FIG. 19 and FIG. 20, the electrode bumps 6 are omitted. The same parts as the third embodiment are given the same numerals in FIG. 19 and FIG. 20, and description thereof is omitted.

A first example of the processing method of a workpiece according to the second modification example is a modification example of the grinding processing according to the third embodiment depicted in FIG. 16 and is a method in which the workpiece 1 is thinned in such a manner that the side end part at the outermost circumference of the workpiece 1 is left and only the inside thereof is ground from the side of the back surface 7 by the grinding abrasive stones 153 of the grinding apparatus 150. That is, the first example is a method in which so-called TAIKO (registered trademark) grinding of the workpiece 1 is executed from the side of the back surface 7.

A second example of the processing method of a workpiece according to the second modification example is the following method. As depicted in FIG. 19, the annular frame 9 of the frame unit 200 is gripped by clamps 187, and the side of the protective component 101 of the frame unit 200 is sucked and held by a holding surface 186 of a chuck table 185. In this state, while a cutting liquid is supplied to the back surface 7 of the workpiece 1, a cutting blade 181 mounted on cutting apparatus 180 is rotated around the axis center, and processing feed, indexing feed, and cutting-in feed of the chuck table 185 or the cutting blade 181 of the cutting apparatus 180 are executed by a drive source that is not depicted in the diagram. Thereby, the workpiece 1 is cut from the side of the back surface 7. In the second example of the processing method of a workpiece according to the second modification example, for example, the workpiece 1 is half-cut, or the workpiece 1 is divided into the semiconductor devices 5, by cutting the workpiece 1 along the planned dividing lines 3 from the side of the back surface 7 and forming cut grooves 189.

A third example of the processing method of a workpiece according to the second modification example is the following method. As depicted in FIG. 20, the annular frame 9 of the frame unit 200 is gripped by clamps 197, and the side of the protective component 101 of the frame unit 200 is sucked and held by a holding surface 196 of a chuck table 195. In this state, laser processing of the workpiece 1 is executed from the side of the back surface 7 by irradiating the back surface 7 of the workpiece 1 with a laser beam 191 from laser irradiation apparatus 190. In the third example of the processing method of a workpiece according to the second modification example, the pulsed laser beam 191 may be used. In the third example of the processing method of a workpiece according to the second modification example, for example, laser-processed grooves 199 are formed by irradiating the workpiece 1 with the laser beam 191 from the side of the back surface 7 along the planned dividing lines 3. In the third example of the processing method of a workpiece according to the second modification example, by executing so-called ablation processing, the workpiece 1 may be half-cut or be divided into the semiconductor devices 5, or a modified layer may be formed inside.

In the processing method of a workpiece according to the second modification example, the object to be processed may be changed to the frame unit 200-2 according to the fourth embodiment.

The processing method of a workpiece according to the second modification example having the above configuration is the method in which the side of the protective component 101 of the workpiece 1 for which the protective component 101 has been bonded to the front surface 4 by the setting method of a protective component according to the third embodiment is sucked and held by the holding surface 156, 186, or 196 of the chuck table 155, 185, or 195 and the workpiece 1 is processed from the side of the back surface 7, which is the other surface side, similarly to the processing method of a workpiece according to the third embodiment. Therefore, the processing method of a workpiece according to the second modification example provides the same advantageous effect as the processing method of a workpiece according to the third embodiment.

Furthermore, the processing method of a workpiece according to the second modification example is a method obtained by further disposing the annular frame 9 or the thicker part 109 at the peripheral edge of the protective component 101 set on the workpiece 1 to be processed in the processing method of a workpiece according to the first modification example. Thus, the processing method of a workpiece according to the second modification example allows modifications and applications similar to those of the processing method of a workpiece according to the first modification example and provides similar advantageous effect.

Third Modification Example

Figure 21:
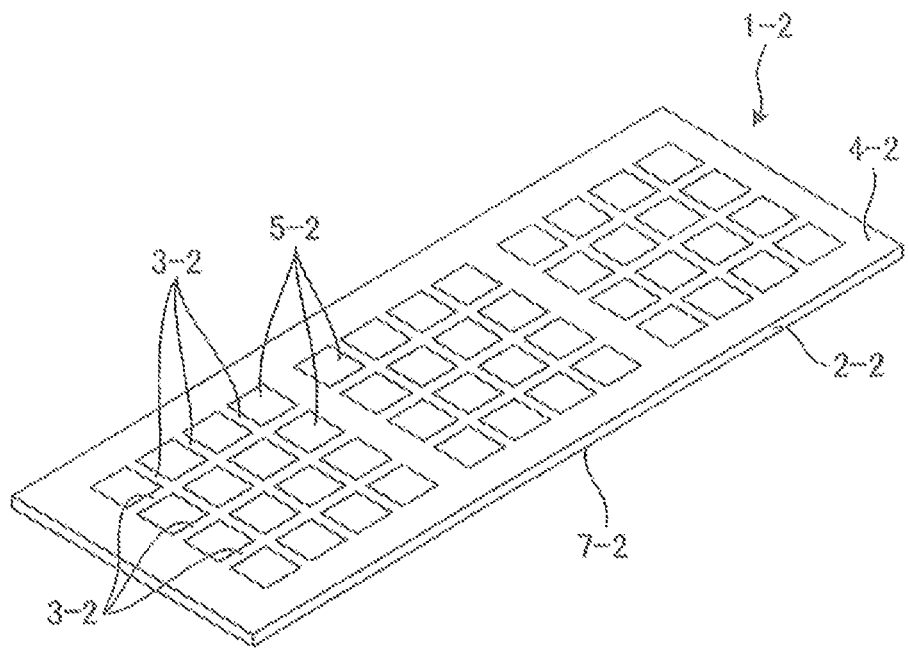
FIG. 21 is a perspective view depicting a workpiece to be processed in a setting method of a protective component and a processing method of a workpiece according to a third modification example.
Figure 22:
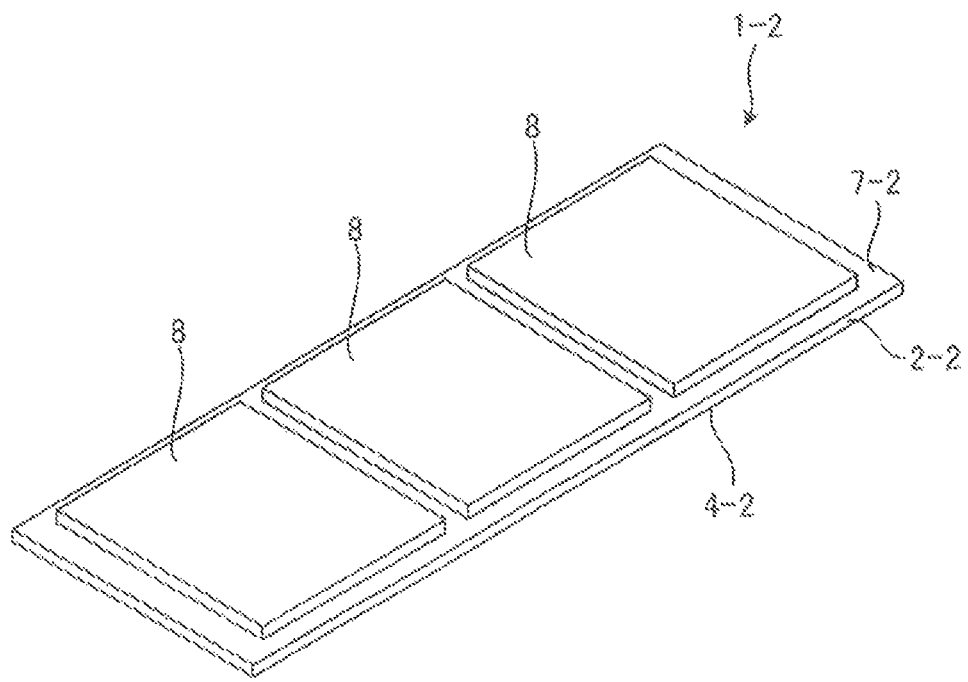
FIG. 22 is a perspective view depicting the workpiece to be processed in the setting method of a protective component and the processing method of a workpiece according to the third modification example.

A setting method of a protective component and a processing method of a workpiece according to a third modification example of the present invention will be described based on drawings. FIG. 21 is a perspective view depicting a workpiece 1-2 which is an object to be processed in the setting method of a protective component and the processing method of a workpiece according to the third modification example. FIG. 22 is a perspective view depicting the workpiece 1-2 which is the object to be processed in the setting method of a protective component and the processing method of a workpiece according to the third modification example. FIG. 21 is the perspective view of the workpiece 1-2 as viewed from the side of a front surface 4-2, and FIG. 22 is the perspective view of the workpiece 1-2 as viewed from the side of a back surface 7-2.

The setting method of a protective component according to the third modification example is the same as the above-described embodiments except that the setting object of the protective component 101 is the workpiece 1-2 depicted in FIG. 21, and FIG. 22 and the shapes of the support tables 10, 110, and 160, the pressing component 20, the protective component tight-contact apparatus 30, the suction holding tables 40, 60, 140, and 170, the pressing components 50 and 175, and the cutting-off apparatus 70 that are used are different according to the shape of the workpiece 1-2. The processing method of a workpiece according to the third modification example is the same as the above-described embodiments and modification examples except that the object to be processed is the workpiece 1-2 and the shapes of the grinding apparatuses 80 and 150, the cutting apparatuses 120 and 180, and the laser irradiation apparatuses 130 and 190 that are used are different according to the shape of the workpiece 1-2.

In the third modification example, the workpiece 1-2 is a package substrate that has an insulating plate with insulation and a ground line that is buried inside the insulating plate and is composed of an electrically-conductive metal and includes a wiring board 2-2 in which electrodes and various kinds of interconnects are formed on the front surface 4-2 and the back surface 7-2. In the workpiece 1-2, a semiconductor device 5-2 is formed in each of the regions on the front surface 4-2 marked out by plural planned dividing lines 3-2 that intersect (in the third modification example, perpendicularly intersect) to each other, as depicted in FIG. 21. In the workpiece 1-2, on the back surface 7-2 of the wiring board 2-2, sealants 8 (see FIG. 22) that seal the respective semiconductor devices 5-2 and wires that are formed for the respective semiconductor devices 5-2 by wire bonding and are not depicted in the diagram are formed. The sealant 8 is a so-called mold resin composed of an epoxy resin, silicone resin, urethane resin, unsaturated polyester resin, acrylic urethane resin, polyimide resin, or the like. The workpiece 1-2 includes structural objects including projections and recesses due to the formation of the semiconductor devices 5-2 on the front surface 4-2 and the formation of the sealants 8 on the back surface 7-2. The workpiece 1-2 is split along each planned dividing line 3-2 and is divided into the individual semiconductor devices 5-2.

The setting method of a protective component and the processing method of a workpiece according to the third modification example are methods obtained by changing the setting object of the protective component 101 and the object to be processed to the workpiece 1-2 in the above-described embodiments and modification examples and therefore, provide the same advantageous effect as the above-described embodiments and modification examples.

Furthermore, the setting method of a protective component and the processing method of a workpiece according to the third modification example use the thermoplastic resin 100 for formation of the protective component 101 and therefore, provide an advantageous effect that the thermoplastic resin 100 hardly reacts with the curable resin that is used for the sealants 8 and has gone through curing reaction, such as an epoxy resin, silicone resin, urethane resin, unsaturated polyester resin, acrylic urethane resin, or polyimide resin, and the protective component 101 can be stably formed.

Fourth Modification Example

A setting method of a protective component and a manufacturing method of a protective component according to a fourth modification example of the present invention will be described based on drawings. FIG. 23 to FIG. 32 are each a perspective view depicting one example of the resin supply step ST11 in the setting method of a protective component according to the fourth modification example. The same parts as the above-described embodiments and modification examples are given the same numerals in FIG. 23 to FIG. 32, and description thereof is omitted.

The setting method of a protective component and the manufacturing method of a protective component according to the fourth modification example are the same as the above-described respective embodiments except that the resin supply step ST11 is different. FIG. 23 to FIG. 32 depict examples in which a thermoplastic resin 100-2 to a thermoplastic resin 100-13 are supplied to the support surface 11 of the support table 10 used in the first embodiment.

Figure 23:
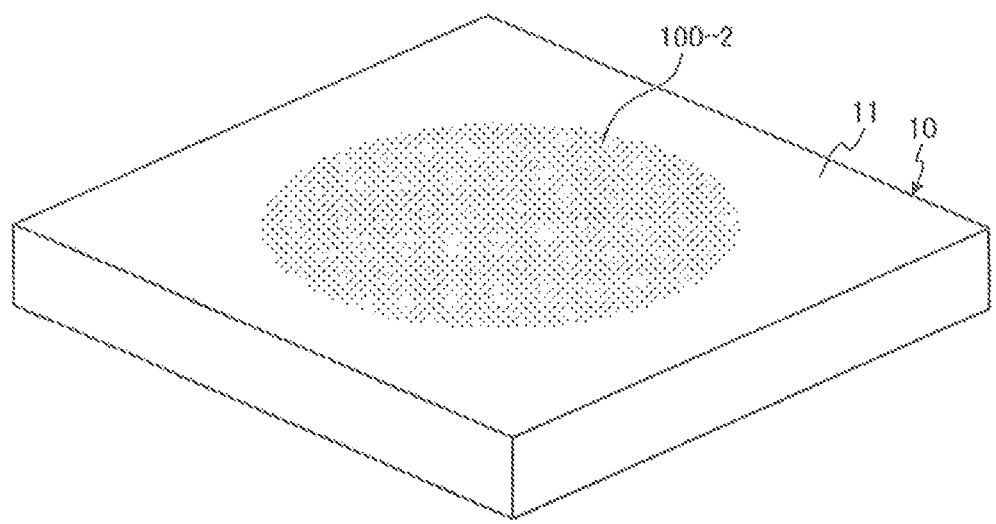
FIG. 23 is a perspective view depicting one example of a resin supply step in a setting method of a protective component according to a fourth modification example.
Figure 24:
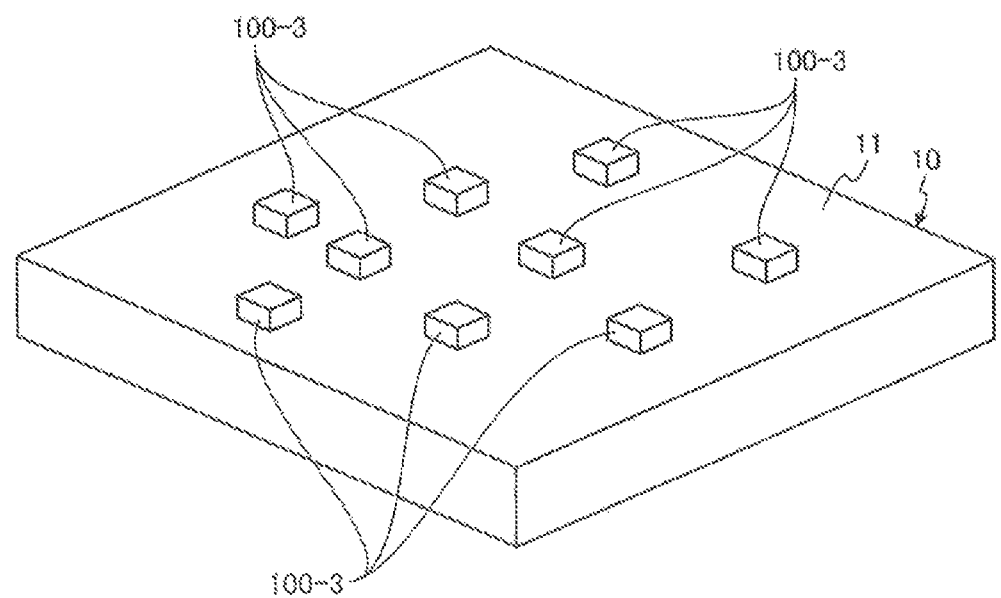
FIG. 24 is a perspective view depicting one example of the resin supply step in the setting method of a protective component according to the fourth modification example.
Figure 25:
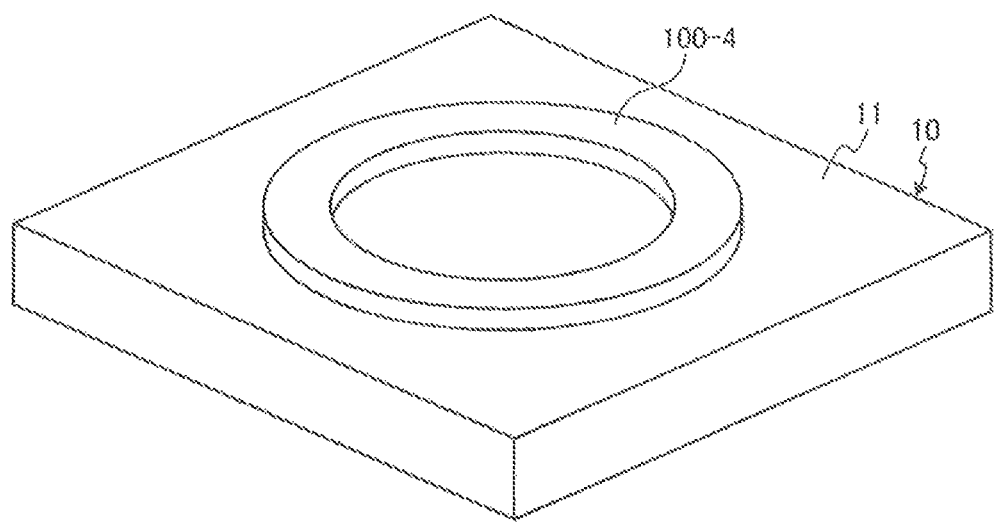
FIG. 25 is a perspective view depicting one example of the resin supply step in the setting method of a protective component according to the fourth modification example.
Figure 26:
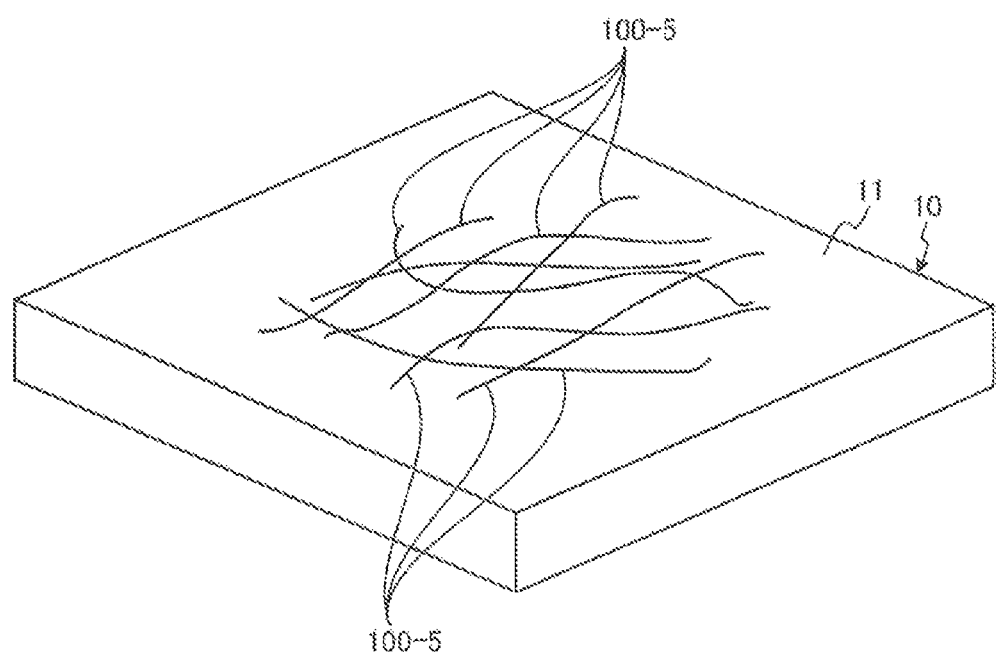
FIG. 26 is a perspective view depicting one example of the resin supply step in the setting method of a protective component according to the fourth modification example.

In a first example of the resin supply step ST11 according to the fourth modification example, the powder-form thermoplastic resin 100-2 (thermoplastic resin powder) is supplied as depicted in FIG. 23. In a second example of the resin supply step ST11 according to the fourth modification example, one or plural block-form thermoplastic resins 100-3 (thermoplastic resin block) are supplied as depicted in FIG. 24. In a third example of the resin supply step ST11 according to the fourth modification example, the doughnut-form thermoplastic resin 100-4 (thermoplastic resin doughnut) is supplied as depicted in FIG. 25. In a fourth example of the resin supply step ST11 according to the fourth modification example, the noodle-form (fiber-form) thermoplastic resin 100-5 (thermoplastic resin fiber) is supplied as depicted in FIG. 26.

Figure 27:
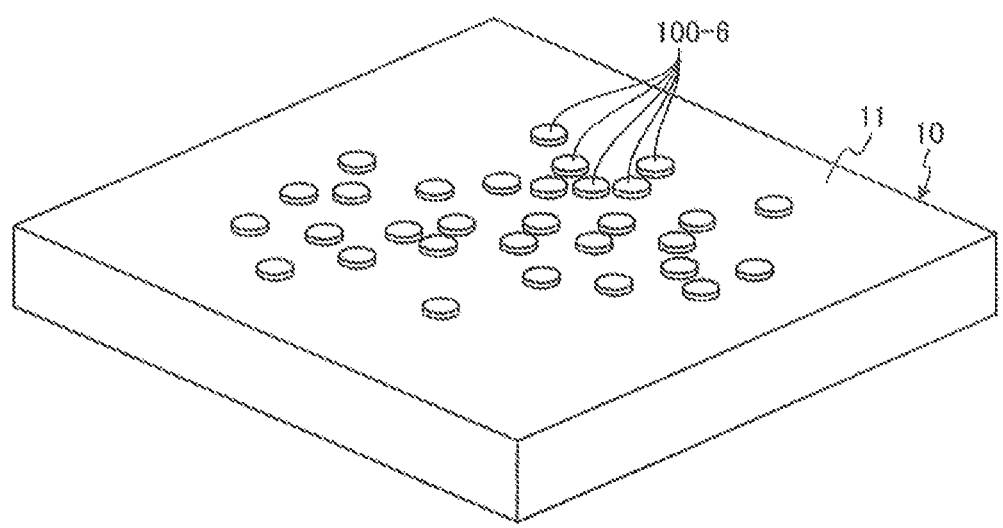
FIG. 27 is a perspective view depicting one example of the resin supply step in the setting method of a protective component according to the fourth modification example.
Figure 28:
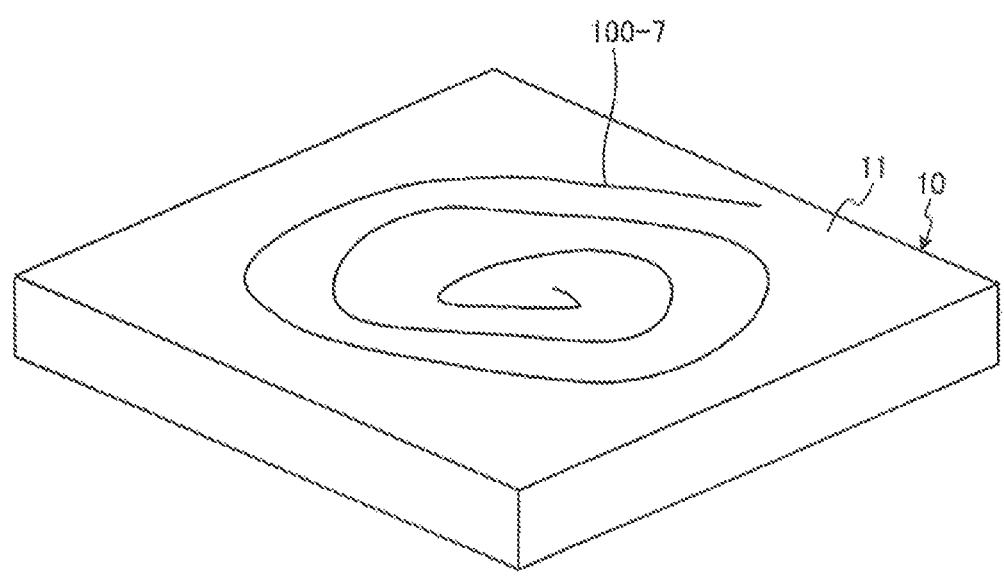
FIG. 28 is a perspective view depicting one example of the resin supply step in the setting method of a protective component according to the fourth modification example.
Figure 29:
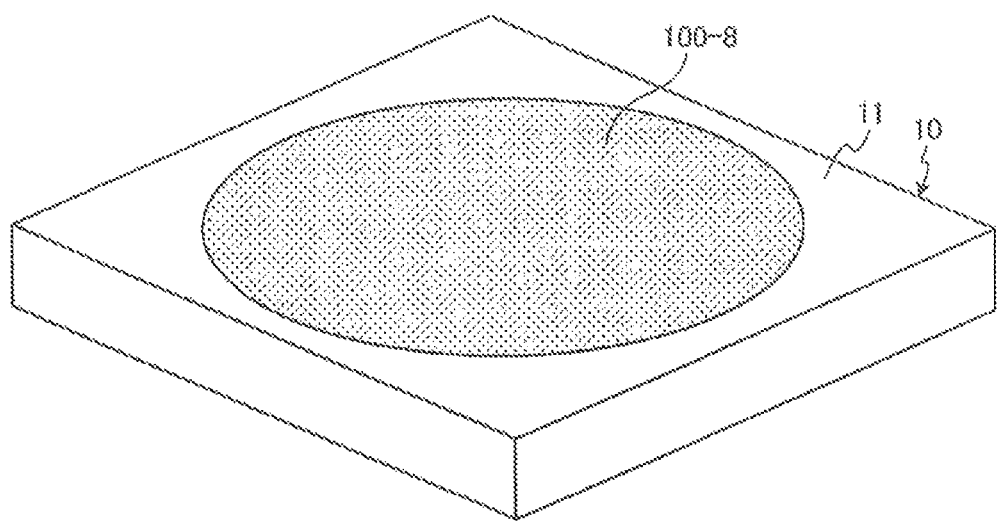
FIG. 29 is a perspective view depicting one example of the resin supply step in the setting method of a protective component according to the fourth modification example.
Figure 30:
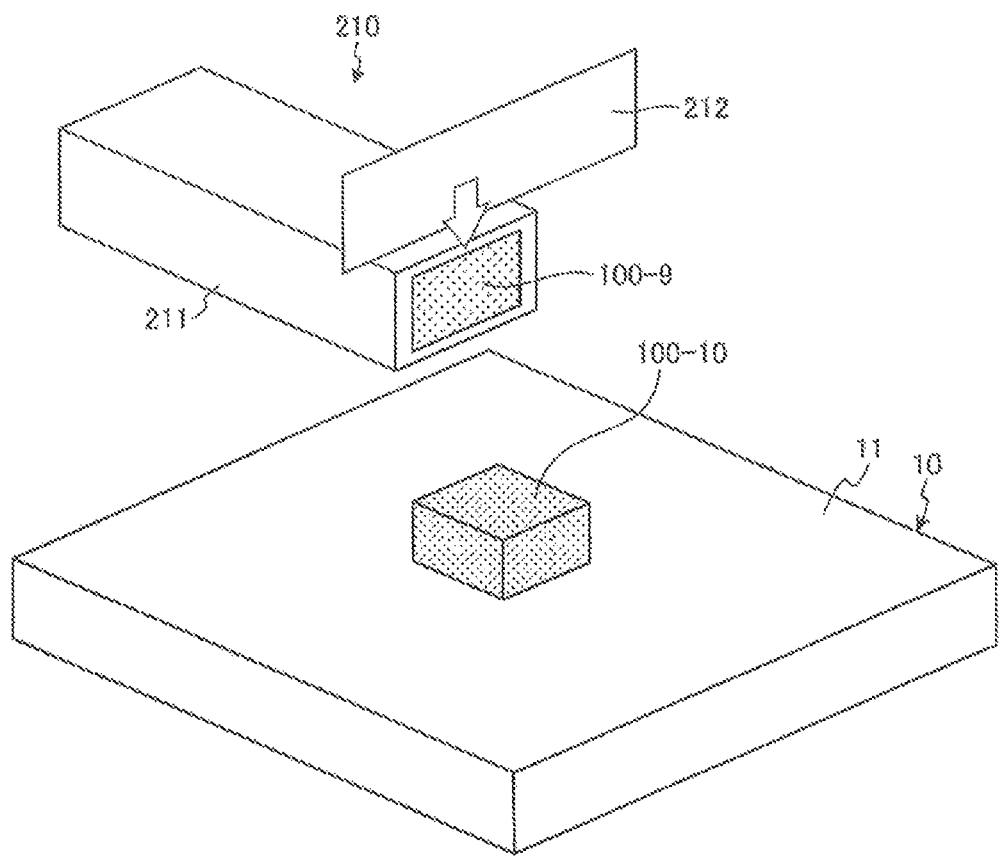
FIG. 30 is a perspective view depicting one example of the resin supply step in the setting method of a protective component according to the fourth modification example.

In a fifth example of the resin supply step ST11 according to the fourth modification example, one or plural tablet-form thermoplastic resins 100-6 (thermoplastic resin tablet) are supplied as depicted in FIG. 27. In a sixth example of the resin supply step ST11 according to the fourth modification example, the fiber-form (string-form) thermoplastic resin 100-7 disposed in a spiral manner (thermoplastic resin spiral) is supplied as depicted in FIG. 28. In a seventh example of the resin supply step ST11 according to the fourth modification example, the thin-piece-form thermoplastic resin 100-8 (thermoplastic resin thin piece) obtained by thinly slicing the solid thermoplastic resin 100 is supplied as depicted in FIG. 29. In an eighth example of the resin supply step ST11 according to the fourth modification example, as depicted in FIG. 30, the solid thermoplastic resin 100-9 that is supplied through passing inside a supply tube 211 with a rectangular tube shape in a resin supply part 210 and has a rectangular column shape is cut by a cutter 212 disposed along a supply port of the supply tube 211. Thereby, the thermoplastic resin 100-10 with a form of a cut sweet bean jelly (thermoplastic resin sweet bean jelly piece) is supplied.

Figure 31:
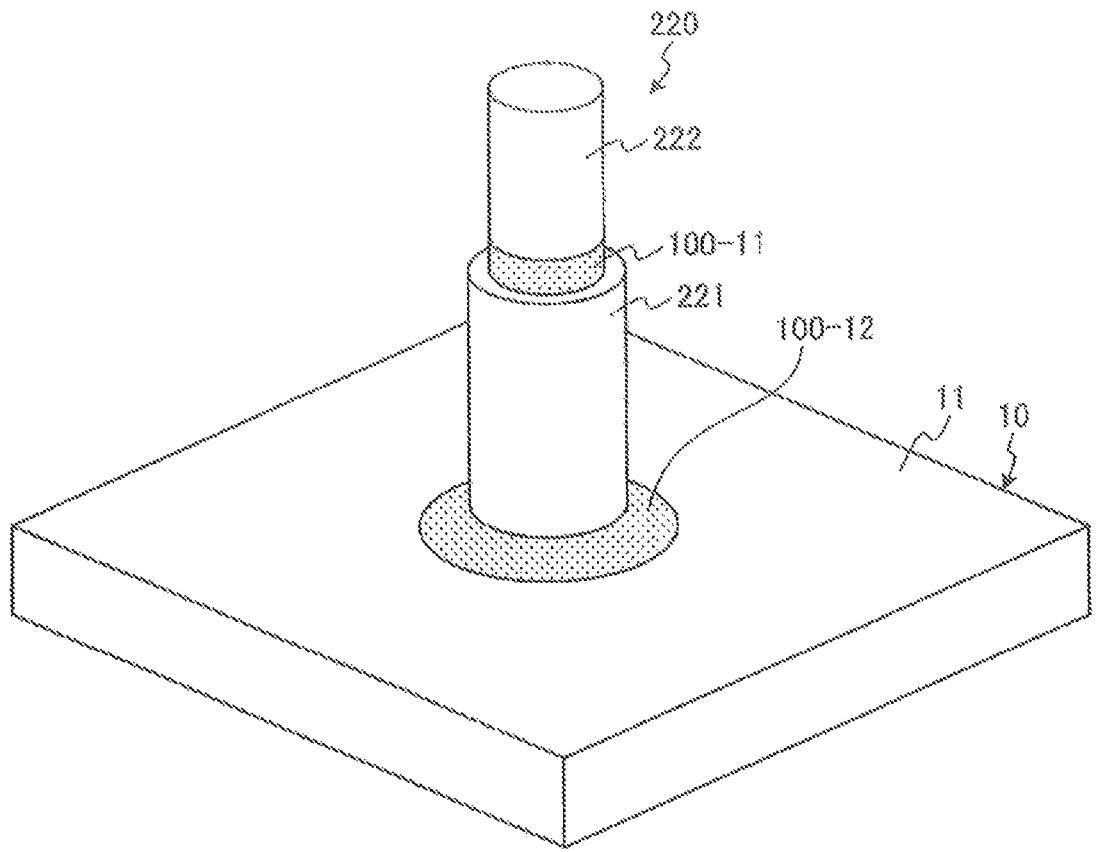
FIG. 31 is a perspective view depicting one example of the resin supply step in the setting method of a protective component according to the fourth modification example.
Figure 32:
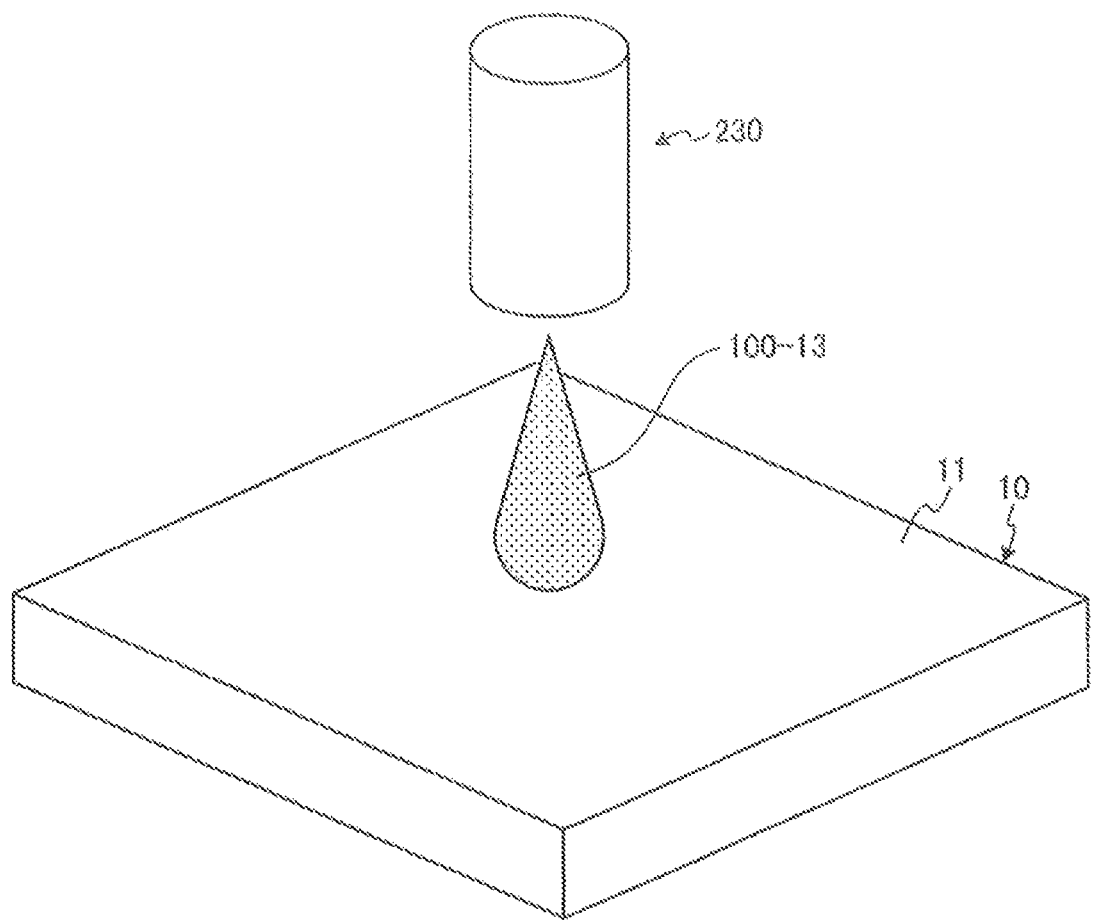
FIG. 32 is a perspective view depicting one example of the resin supply step in the setting method of a protective component according to the fourth modification example.

In a ninth example of the resin supply step ST11 according to the fourth modification example, as depicted in FIG. 31, the solid thermoplastic resin 100-11 that is supplied through passing inside a heating part 221 with a circular tube shape in a resin supply part 220 and has a circular column shape is pushed out from the upper side of the heating part 221 to the lower side by a pressing part 222 while being heated and softened by the heating part 221. Thereby, the thermoplastic resin 100-12 that has been softened and become fluid (thermoplastic resin fluid) is supplied. In a tenth example of the resin supply step ST11 according to the fourth modification example, the thermoplastic resin 100-13 of fluid (thermoplastic resin fluid) is supplied from a resin supply part 230 as depicted in FIG. 32. The method for supplying the thermoplastic resin 100-11 or 100-13 of fluid in the resin supply step ST11 according to the fourth modification example is not limited to these methods in the present invention. With use of a glue gun or the like, the thermoplastic resin 100 may be heated and softened by a heater with which the glue gun or the like is equipped, and the thermoplastic resin 100 may be supplied from this glue gun or the like to the support surface 11 of the support table 10.

These setting methods of a protective component and manufacturing methods of a protective component according to the fourth modification example are methods obtained by changing the method for supplying the thermoplastic resin 100-2 to the thermoplastic resin 100-13 in the resin supply step ST11 in the above-described embodiments and therefore, provide the same advantageous effect as the above-described embodiments.

Fifth Modification Example

A setting method of a protective component, a manufacturing method of a protective component, and a processing method of a workpiece according to a fifth modification example of the present invention will be described below. The setting method of a protective component and the manufacturing method of a protective component according to the fifth modification example are the same as the above-described embodiments except that the resin supply step ST11 is different. In the resin supply step ST11 according to the fifth modification example, the thermoplastic resin 100 into which a filler that is a filling agent with a smaller coefficient of thermal expansion than the thermoplastic resin 100 is mixed is supplied. The processing method of a workpiece according to the fifth modification example is the same as the above-described respective embodiments and respective modification examples except that the filler is mixed into the protective component 101 to be set on the workpiece 1 of the object to be processed.

As the filler mixed into the thermoplastic resin 100 supplied in the resin supply step ST11 according to the fifth modification example, an inorganic filling agent or organic filling agent with a smaller coefficient of thermal expansion than the thermoplastic resin 100 is favorably used. Due to the mixing of such a filler into the thermoplastic resin 100, shrinking of the protective component 101 in cooling in the post-shaping cooling step or the post-bonding cooling step ST14 can be reduced and prevented. In association with this, the workpiece 1 on which the protective component 101 is set can be prevented from being bent or deformed.

It is preferable that the filler mixed into the thermoplastic resin 100 is an inorganic filling agent. Specifically, the following substances are favorably used: fused silica, crystalline silica, alumina, calcium carbonate, calcium silicate, barium sulfate, talc, clay, magnesium oxide, aluminum oxide, beryllium oxide, iron oxide, titanium oxide, aluminum nitride, silicon nitride, boron nitride, mica, glass, quartz, and so forth. Furthermore, two or more kinds of substances in the above-described substances may be mixed to be used as the filler mixed into the thermoplastic resin 100. It is preferable that silica such as fused silica or crystalline silica in the above-described inorganic filling agents is used as the filler mixed into the thermoplastic resin 100. In this case, the cost of the filler can be favorably suppressed. It is preferable that the size of the filler mixed into the thermoplastic resin 100 is several micrometers to 0.1 nm. When the size is equal to or smaller than 400 nm, the filler is nearly transparent because visible light is not absorbed or scattered, and observing the workpiece 1 through the protective component 101 is not hindered. Therefore, it is possible to easily execute alignment in which the semiconductor devices 5 are observed through the protective component 101 fixed to the device surface side of the semiconductor devices 5.

Furthermore, the protective component 101 obtained through the setting method of a protective component and the manufacturing method of a protective component according to the fifth modification example is what is obtained by mixing the above-described filler into the thermoplastic resin 100 that forms the protective component 101.

In the setting method of a protective component and the manufacturing method of a protective component according to the fifth modification example, the filler is mixed into the thermoplastic resin 100 supplied in the resin supply step ST11. Therefore, shrinking of the protective component 101 obtained as the result of these methods at the time of cooling can be reduced and prevented due to the effect of the mixed filler. In association with this, the workpiece 1 can be prevented from being bent or deformed due to the difference in the coefficient of thermal expansion between the workpiece 1 and the thermoplastic resin 100. Furthermore, the setting method of a protective component and the manufacturing method of a protective component may be executed in such a manner that the fifth modification example is combined with the fourth modification example. In this case, the thermoplastic resin 100-2 to the thermoplastic resin 100-13 according to the fourth modification example are all thermoplastic resins into which the filler is mixed.

The processing method of a workpiece according to the fifth modification example is a method obtained by mixing the filler into the protective component 101 set on the workpiece 1 of the object to be processed in any of the above-described embodiments and modification examples and therefore, provides the same advantageous effect as the above-described embodiments and modification examples. Moreover, in the case of cutting the protective component 101 into which the filler is mixed by the cutting blade 121 or 181, the processing method of a workpiece according to the fifth modification example provides an advantageous effect that wear of the cutting blade 121 or 181 is promoted by the filler and a dressing effect of the cutting blade 121 or 181 occurs.

The present invention is not limited to the above-described embodiments. That is, the present invention can be executed with various modifications without departing from the gist of the present invention. For example, the thermoplastic resin 100 used in the above-described embodiments and modification examples may be colored in a dark color such as black, or an ultraviolet absorber may be kneaded into it for the purpose of circuit protection from ultraviolet rays or concealment of a circuit.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A setting method of a protective component that protects one surface of a plate-shaped workpiece having a plurality of regions in which a plurality of devices are formed, the setting method comprising:
   a resin supply step of supplying a thermoplastic resin in a lump form, a string form, a powder form, or a fluid form to a flat support surface of a support table;
   a protective component forming step of shaping the thermoplastic resin into a sheet shape through pressing and spreading the thermoplastic resin along the support surface while heating and softening the thermoplastic resin to form a protective component of the thermoplastic resin in the sheet shape on the support surface;
   a protective component bonding step of bringing the one surface of the workpiece, including the plurality of regions in which the plurality of devices is formed, into direct contact with one surface of the protective component in the sheet shape and heating the protective component in tight contact to bond the protective component to the workpiece; and
   a post-bonding cooling step of cooling the protective component heated in the protective component bonding step.

2. The setting method of a protective component according to claim 1, wherein
   in a condition of heating the protective component in the protective component bonding step, a temperature is lower, or a heating time is shorter, compared with a condition of heating the thermoplastic resin in the protective component forming step.

3. The setting method of a protective component according to claim 1, wherein
   the protective component forming step includes a post-shaping cooling step of cooling the protective component shaped into the sheet shape.

4. The setting method of a protective component according to claim 1, wherein
   the thermoplastic resin is shaped into the sheet shape with such a size as to cover the one surface of the workpiece without discontinuity in the protective component forming step.

5. The setting method of a protective component according to claim 1, wherein
   the thermoplastic resin is pressed and spread by a flat pressing surface parallel to the support surface in the protective component forming step.

6. The setting method of a protective component according to claim 1, wherein
   the one surface of the workpiece has structural objects including projections and recesses, and a thickness of the protective component in the sheet shape shaped in the protective component forming step is set thicker than a height of each of the projections and recesses.

7. The setting method of a protective component according to claim 1, wherein
   a filler is mixed into the thermoplastic resin supplied in the resin supply step.

8. The setting method of a protective component according to claim 1, wherein
   in the protective component bonding step, a peripheral region of the protective component around an outer circumference of the workpiece is bonded to an annular frame that surrounds the workpiece, and a frame unit in which the workpiece is fixed in an opening of the annular frame through the protective component is formed.

9. The setting method of a protective component according to claim 1, wherein
   in the protective component forming step, a thicker part of the thermoplastic resin is formed at a peripheral edge of the protective component in the sheet shape, and in the protective component bonding step, the workpiece is bonded to a region in the sheet shape, and the thicker part functions as a reinforcing component.

10. The setting method of a protective component according to claim 1, wherein
    a heating time of the thermoplastic resin is shorter, or a heating temperature of the thermoplastic resin is lower, or an amount of pressing of the thermoplastic resin is smaller, when the thermoplastic resin is bonded to the workpiece in the protective component bonding step than when the thermoplastic resin is shaped in the protective component forming step.

11. The setting method of a protective component according to claim 1, wherein
    the workpiece is a semiconductor wafer having a plurality of semiconductor devices on a front surface.

* * * * *